United States Patent
Kijima et al.

(10) Patent No.: US 7,186,570 B2
(45) Date of Patent: Mar. 6, 2007

(54) METHOD OF MANUFACTURING CERAMIC FILM, METHOD OF MANUFACTURING FERROELECTRIC CAPACITOR, CERAMIC FILM, FERROELECTRIC CAPACITOR, AND SEMICONDUCTOR DEVICE

(75) Inventors: Takeshi Kijima, Matsumoto (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 67 days.

(21) Appl. No.: 10/722,422

(22) Filed: Nov. 28, 2003

(65) Prior Publication Data

US 2004/0224188 A1 Nov. 11, 2004

(30) Foreign Application Priority Data

Dec. 24, 2002 (JP) ............... 2002-371522

(51) Int. Cl.
*H01L 21/00* (2006.01)
*C30B 1/00* (2006.01)

(52) U.S. Cl. ............. 438/3; 117/6; 117/7; 257/E21.002
(58) Field of Classification Search ................ 438/240, 438/3; 117/4, 6, 7
See application file for complete search history.

(56) References Cited

U.S. PATENT DOCUMENTS

| 5,520,855 A | * | 5/1996 | Ito et al. ..................... 252/582 |
| 6,143,366 A | * | 11/2000 | Lu ............................ 427/376.3 |
| 6,150,183 A | * | 11/2000 | Fukuda et al. .................. 438/3 |
| 6,338,996 B1 | * | 1/2002 | Iizuka ........................ 438/240 |
| 6,407,010 B1 | * | 6/2002 | Ashizawa et al. .......... 438/785 |
| 6,548,342 B1 | * | 4/2003 | Suzuki et al. ............... 438/240 |
| 6,730,562 B2 | * | 5/2004 | Engelhardt et al. ......... 438/253 |
| 6,887,716 B2 |  | 5/2005 | Fox et al. |
| 2002/0035961 A1 |  | 3/2002 | Natori et al. |
| 2003/0020157 A1 | * | 1/2003 | Natori et al. ................ 257/703 |
| 2003/0096472 A1 | * | 5/2003 | Kang et al. .................. 438/239 |
| 2003/0227803 A1 | * | 12/2003 | Natori et al. ................ 365/200 |
| 2004/0125176 A1 | * | 7/2004 | Kobayashi et al. ........... 347/68 |
| 2004/0227278 A1 | * | 11/2004 | Kijima et al. ................ 264/615 |
| 2004/0241330 A1 | * | 12/2004 | Kijima et al. ............. 427/372.2 |
| 2004/0248360 A1 | * | 12/2004 | Ohashi et al. .............. 438/240 |

FOREIGN PATENT DOCUMENTS

| CN | 1371124 A | 9/2002 |
| WO | WO 00/17929 | 3/2000 |

* cited by examiner

*Primary Examiner*—Scott B. Geyer
(74) *Attorney, Agent, or Firm*—Oliff & Berridge, PLC

(57) ABSTRACT

A lower electrode is formed over a substrate, and a raw material including a complex oxide is heated in an atmosphere pressurized to two atmospheres or more and containing oxygen at a volume ratio of 10% or less at a temperature raising rate of 100° C./min or less, thereby forming a lower alloy film of a compound of a first metal which makes up the complex oxide, and a second metal, which makes up the lower electrode, over the lower electrode. A ceramic film in which the raw material is crystallized is formed over the lower alloy film, and an upper electrode is formed over the ceramic film.

6 Claims, 19 Drawing Sheets

AVERAGE PARTICLE DIAMETER : 50mn

Solgel:MOD=1:1

AVERAGE PARTICLE DIAMETER: 50 nm

Solgel:MOD=2:1

AVERAGE PARTICLE DIAMETER: 30 nm

ONLY MOD

AVERAGE PARTICLE DIAMETER: 2 μm

ONLY SolGel

AVERAGE PARTICLE DIAMETER: 100 nm

Solgel:MOD=1:2

AVERAGE PARTICLE DIAMETER: 70 nm

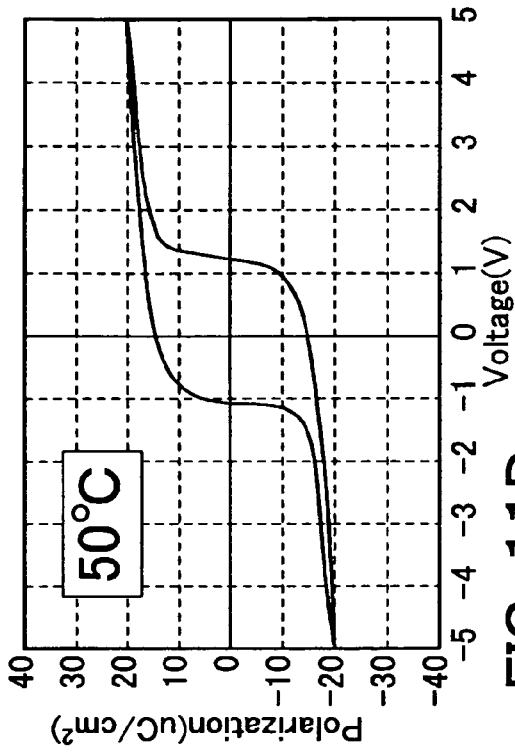
FIG. 11A 25°C
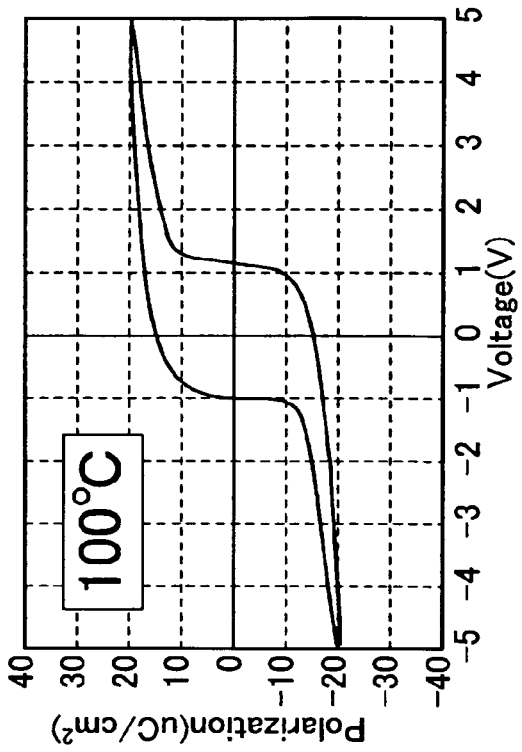
FIG. 11B 50°C
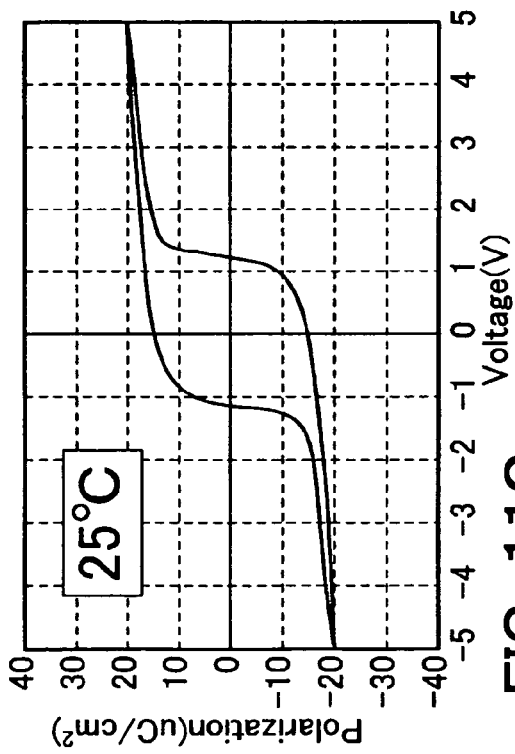
FIG. 11C 75°C
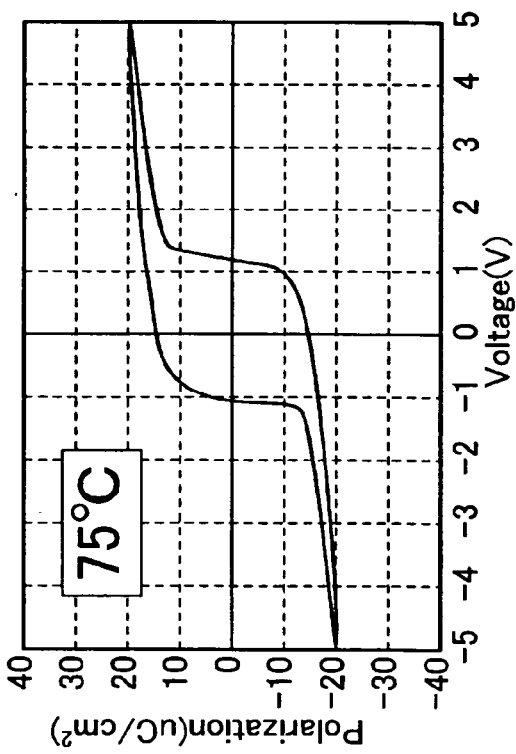
FIG. 11D 100°C

MOD

Solgel+MOD

580°C

425°C

US 7,186,570 B2

METHOD OF MANUFACTURING CERAMIC FILM, METHOD OF MANUFACTURING FERROELECTRIC CAPACITOR, CERAMIC FILM, FERROELECTRIC CAPACITOR, AND SEMICONDUCTOR DEVICE

Japanese Patent Application No. 2002-371522, filed on Dec. 24, 2002, is hereby incorporated by reference in its entirety.

BACKGROUND OF THE INVENTION

The present invention relates to a method of manufacturing a ceramic film, a method of manufacturing a ferroelectric capacitor, a ceramic film, a ferroelectric capacitor, and a semiconductor device.

As a ferroelectric film applied to semiconductor devices (ferroelectric memory (FeRAM), for example), a ferroelectric film having a perovskite structure (PbZrTiO, for example) and a ferroelectric film having a layered perovskite structure (BiLaTiO, BiTiO, or SrBiTaO, for example) have been proposed.

Pb or Bi contained in the material for the ferroelectric film easily volatilizes at low temperature due to high vapor pressure. Since a high-temperature heat treatment is performed during the crystallization process of the ferroelectric film, Pb or Bi bonds to oxygen in the atmosphere necessary for crystallization of the ferroelectric and scatters, thereby adversely affecting the characteristics of the crystallized ferroelectric film.

Since the lattice constant of the crystallized ferroelectric film does not necessarily coincide with the lattice constant of the metal film used as the electrode material, strain due to lattice mismatch occurs in the case where the ferroelectric film is applied to a ferroelectric capacitor having a metal-insulator-metal (MIM) structure, whereby the characteristics tend to deteriorate. In order to eliminate such a lattice mismatch, a capacitor structure in which an alloy film is formed between the ferroelectric film and the electrode has been proposed (see pamphlet of international publication No. 00/17929).

BRIEF SUMMARY OF THE INVENTION

The present invention may provide a method of manufacturing a ceramic film having excellent characteristics and a ceramic film obtained by this manufacturing method. The present invention may also provide a method of manufacturing a ferroelectric capacitor which can improve the interface between the ceramic film and the electrode and improve fatigue characteristics, and a ferroelectric capacitor obtained by this manufacturing method. The present invention may further provide a semiconductor device to which the ceramic film or the ferroelectric capacitor of the present invention is applied.

A method of manufacturing a ceramic film according to the present invention includes crystallizing a raw material including a complex oxide by subjecting the raw material to a heat treatment in an atmosphere pressurized to two atmospheres or more and containing oxygen at a volume ratio of 10% or less.

BRIEF DESCRIPTION OF THE SEVERAL VIEWS OF THE DRAWING

FIGS. 11A to 11D show temperature characteristics of a ferroelectric capacitor according to the example 2.

DETAILED DESCRIPTION OF THE EMBODIMENT

Figure 1A:
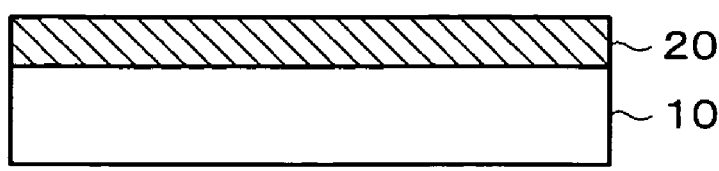
FIGS. 1A to 1E show manufacturing steps of a first ferroelectric capacitor according to an embodiment of the present invention.

1. Method of Manufacturing Ceramic Film (A) A method of manufacturing a ceramic film according to an embodiment of the present invention includes crystallizing a raw material including a complex oxide by subjecting the raw material to a heat treatment in an atmosphere pressurized to two atmospheres or more and containing oxygen at a volume ratio of 10% or less.

According to this embodiment of the present invention, vaporization of the metal material (Pb or Bi, for example) included in the raw material can be reduced by pressurizing to two atmospheres or more, and the metal material can be reduced from bonding to oxygen by limiting the amount of oxygen contained in the atmosphere to 10% or less in volume ratio. Therefore, a ferroelectric film having an excellent crystallization state can be obtained.

(B) A method of manufacturing a ceramic film according to an embodiment of the present invention includes crystallizing a raw material including a complex oxide by subjecting the raw material to a heat treatment in a state pressurized to two atmospheres or more using a rapid thermal annealing method.

According to this embodiment of the present invention, vaporization of the metal material (Pb or Bi, for example) included in the raw material due to a high-temperature heat treatment can be reduced by pressurizing to two atmospheres or more.

If the ferroelectric film is heated at a low speed in a heat treatment for crystallization, initial crystal nuclei are formed at various angles, whereby the crystal planes tend to be oriented at random. In this embodiment of the present invention, a highly oriented ceramic film can be obtained by performing the heat treatment using the rapid thermal annealing method in which the raw material is rapidly heated at several tens of degrees per second or more.

With the method of manufacturing a ceramic film according to this embodiment of the present invention, the metal material included in the raw material can be reduced from bonding to oxygen by performing the heat treatment in an atmosphere containing oxygen at a volume ratio of 10% or less. Therefore, a ceramic film having a further excellent crystallization state can be obtained.

2. Method of Manufacturing Ferroelectric Capacitor (A) A method of manufacturing of a ferroelectric capacitor according to an embodiment of the present invention includes: p forming a lower electrode over a substrate; p heating a raw material including a complex oxide in an atmosphere pressurized to two atmospheres or more and containing oxygen at a volume ratio of 10% or less at a temperature raising rate of 100° C./min or less, thereby forming a lower alloy film of a compound of a first metal and a second metal over the lower electrode, the first metal making up the complex oxide and the second metal making up the lower electrode; and forming a ceramic film, in which the raw material is crystallized, over the lower alloy film; and p forming an upper electrode over the ceramic film.

In this embodiment of the present invention, the first metal is a metal included in the complex oxide which becomes the ferroelectric. In the case of a ferroelectric film having a perovskite structure, Pb, Zr, Ti, and the like can be given, for example. In the case of a ferroelectric film having a layered perovskite structure, Bi, La, Ti, Sr, Ta, and the like can be given, for example. However, the present invention is not limited thereto.

In this embodiment of the present invention, the second metal is selected from conventional substances used as the electrode material for the ferroelectric capacitor. For example, Pt, Ir, Al, Au, Ag, Ru, or Sr, a conductive oxide or a conductive nitride including these elements in the constituent elements, and the like can be given. However, the metal element is not limited thereto.

According to this embodiment of the present invention, vaporization of the metal material (Pb or Bi, for example) included in the raw material can be reduced by pressurizing to two atmospheres or more, and the metal material can be reduced from bonding to oxygen by limiting the amount of oxygen contained in the atmosphere to 10% or less in volume ratio. Therefore, a ferroelectric film having an excellent crystallization state can be obtained.

In this embodiment of the present invention, a ceramic film is crystallized while forming a lower alloy film which tends to lattice match with the lower electrode and the ceramic film in a comparatively lower temperature region in the temperature raising process of the heat treatment at a temperature raising rate of 100° C./min or less in the heat treatment. This reduces lattice strain due to lattice mismatch between the lower electrode and the ceramic film, whereby the interface between each layer is improved. Therefore, a ceramic film having an excellent crystallization state with a small amount of strain can be obtained.

Therefore, according to the manufacturing method of this embodiment of the present invention, since the interface between each layer and the crystallization state of the ceramic film are excellent, the polarization characteristics and fatigue characteristics of the ferroelectric capacitor can be improved.

(B) A method of manufacturing a ferroelectric capacitor according to an embodiment of the present invention includes: p forming a lower electrode over a substrate; p forming an oxide film of a first metal which makes up a complex oxide over the lower electrode; p subjecting the oxide film to a first heat treatment in a state pressurized to two atmospheres or more, thereby forming a lower alloy film of a compound of the first metal and a second metal which makes up the lower electrode; p subjecting a raw material including the complex oxide to a second heat treatment in a state pressurized to two atmospheres or more by using a rapid thermal annealing method, thereby forming a ceramic film in which the raw material is crystallized over the lower alloy film; and p forming an upper electrode over the ceramic film.

In this embodiment of the present invention, the first metal and the second metal are the same as defined for the above method of manufacturing the ferroelectric capacitor.

According to this embodiment of the present invention, the oxide film of the first metal which makes up the complex oxide is formed over the lower electrode, and the lower alloy film made up of the compound of the first metal and the second metal which makes up the lower electrode is formed by subjecting the oxide film to the first heat treatment. Since the lower alloy film easily lattice-matches with the lower electrode and the ceramic film, a lattice strain due to lattice mismatch between the lower electrode and the ceramic film is reduced, whereby the interface between each layer is improved. Therefore, a ceramic film having an excellent crystallization state with a small amount of strain can be obtained.

In this embodiment of the present invention, vaporization of the metal material (Pb or Bi, for example) included in the raw material can be reduced, and a ceramic film having an excellent crystallization state oriented to a desired crystal plane can be obtained by subjecting the raw material including the complex oxide to the second heat treatment in a state pressurized to two atmospheres or more by using the rapid thermal annealing method in which the raw material is rapidly heated at several tens of degrees per second or more.

Therefore, according to the manufacturing method of this embodiment of the present invention, since the interface between each layer and the crystallization state of the ceramic film are excellent, the polarization characteristics and fatigue characteristics of the ferroelectric capacitor can be increased.

In this method of manufacturing a ferroelectric capacitor according to the embodiment of the present invention, the metal material included in the raw material can be reduced from bonding to oxygen by performing the second heat treatment in an atmosphere containing oxygen at a volume ratio of 10% or less, whereby a ceramic film having a further excellent crystallization state can be obtained. Therefore, the characteristics of the ferroelectric capacitor can be improved.

This method of manufacturing a ferroelectric capacitor may include forming an oxide film of a third metal which makes up the upper electrode over the ceramic film before forming the upper electrode over the ceramic film, and subjecting the oxide film to a heat treatment in a state pressurized to two atmospheres or more, thereby forming an upper alloy film of a compound of the first metal and the third metal, and the upper electrode may be formed over the upper alloy film.

According to this feature, since lattice strain is reduced by the upper alloy film at the interface between the ceramic film and the upper electrode, a ferroelectric capacitor having excellent characteristics can be obtained. Since the heat treatment for forming the upper alloy film is performed in a state pressurized to two atmospheres or more, vaporization of the metal material (Pb or Bi, for example) included in the complex oxide from the surface of the ceramic film can be reduced.

(C) A method of manufacturing a ferroelectric capacitor according to an embodiment of the present invention includes: forming at least a lower electrode, a ceramic film, and an upper electrode over a substrate; and performing a heat treatment for recovering ferroelectric characteristics in a state pressurized to two atmospheres or more after forming at least the upper electrode.

With the method of manufacturing a ferroelectric capacitor according to this embodiment of the present invention, the interfacial state between ceramic film and the upper electrode and the lower electrode is improved by performing the heat treatment as post annealing in a state pressurized to two atmospheres or more after forming the ferroelectric capacitor structure over the substrate, whereby the ferroelectric characteristics can be recovered. In this manufacturing method, the heat treatment may be performed by using the rapid thermal annealing method.

(D) A method of manufacturing a ferroelectric capacitor according to an embodiment of the present invention includes: forming at least a lower electrode, a ceramic film, and an upper electrode over a substrate; and performing a heat treatment for recovering ferroelectric characteristics in a state pressurized to two atmospheres or more after etching at least the ceramic film into a given shape.

With the method of manufacturing a ferroelectric capacitor according to this embodiment of the present invention, process damage during the etching step can be recovered by performing the heat treatment as post annealing in a state pressurized to two atmospheres or more after at least the ceramic film is etched. In this manufacturing method, the heat treatment may be performed by using the rapid thermal annealing method.

The method of manufacturing a ceramic film and the method of manufacturing a ferroelectric capacitor according to the embodiments of the present invention may have any of the following features.

(a) The heat treatment for crystallizing the raw material may include pressurizing to two atmospheres or more at least before raising a temperature.

According to this feature, vaporization of the metal material (Pb or Bi, for example) included in the complex oxide in a low temperature region of the heat treatment can be effectively reduced by increasing the pressure of the atmosphere during the crystallization process before raising the temperature.

(b) The complex oxide may include Pb in constituent elements, and the heat treatment for crystallizing the raw material may include raising a temperature after pressurizing to two atmospheres or more at 100° C. or less in a temperature raising process.

According to this feature, pressurizing to two atmospheres or more in a low temperature region of 100° C. or less during the temperature raising process further ensures the effect of preventing Pb in the raw material of the complex oxide including Pb from bonding to oxygen in the atmosphere to produce vapor during the subsequent heating.

(c) A temperature raising process of the heat treatment for crystallizing the raw material may be performed in a pressurized state with respect to atmospheric pressure, and a temperature lowering process of the heat treatment may be performed at a reduced pressure with respect to the pressurized state.

According to this feature, the metal material can be prevented from being removed from the raw material by pressurization during the temperature raising process, and adhesion of impurities contained in the atmosphere such as an excess material to the ceramic film can be prevented in the temperature lowering process by reducing the pressure from the pressurized state.

(d) The raw material may be a mixture of a sol-gel raw material and an MOD raw material, the sol-gel raw material including at least one of a hydrolysate and a polycondensate of the complex oxide, and the MOD raw material including constituent elements of the complex oxide in an organic solvent.

Since a metal material (Pb or Bi, for example) which easily vaporizes in a low temperature region is included in the complex oxide which makes up the ferroelectric, such material is generally added in an excess amount for crystallization accompanied by a high temperature treatment.

According to this feature, since the raw material is formed by a mixture of a sol-gel raw material, in which the constituent elements of the complex oxide are bonded by hydrolysis or polycondensation, and a MOD raw material, in which each constituent element can move comparatively freely in the solvent, and the sol-gel raw material and the MOD raw material complementarily function in the crystallization process of the raw material, and the amount of excess material added to the raw material can be reduced, whereby a ceramic film having excellent surface morphology can be formed.

(e) The raw material may include the complex oxide and a paraelectric material having a catalytic effect on the complex oxide.

According to this feature, since the paraelectric material is present in the raw material in a mixed state in addition to the complex oxide which makes up a ferroelectric, a part of the constituent elements of the complex oxide is replaced by the constituent element of the paraelectric material during the crystallization process of the complex oxide, whereby the crystallization temperature can be reduced.

The paraelectric material may include an oxide which includes Si or Ge in constituent elements or an oxide which includes Si and Ge in constituent elements.

3. Ceramic Film, Ferroelectric Capacitor, and Semiconductor Device (A) A ceramic film according to an embodiment of the present invention is obtained by the above method of manufacturing a ceramic film.

(B) A ferroelectric capacitor according to an embodiment of the present invention is obtained by the above method of manufacturing a ferroelectric capacitor.

(C) A semiconductor device according to an embodiment of the present invention has the ceramic film according to an embodiment of the present invention as a gate insulating film.

(D) A semiconductor device according to an embodiment of the present invention includes the ferroelectric capacitor according to an embodiment of the present invention.

Preferred embodiments of the present invention are described below in more detail with reference to the drawings.

4. Method of Manufacturing First Ferroelectric Capacitor

FIGS. 1A to 1E are cross-sectional views schematically showing manufacturing steps of a first ferroelectric capacitor according to the present embodiment.

As shown in FIG. 1A, a lower electrode 20 is formed over a substrate 10. The lower electrode 20 may be formed of a material such as a metal (Pt, Ir, Al, Au, Ag, Ru, or Sr, for example), an oxide conductor ($IrO_x$, for example), or a nitride conductor (TiN, for example) by using a sputtering method. The lower electrode 20 may be either a single-layer film or a stacked multilayer film.

Figure 1B:
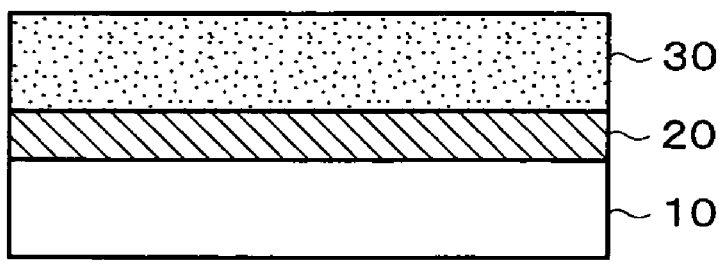

As shown in FIG. 1B, a raw material 30 including a complex oxide is formed over the lower electrode 20. As a method for forming the raw material 30, a coating method and an LSMCD method can be given. As examples of the coating method, a spin coating method and a dipping method can be given. The raw material 30 includes a sol-gel raw material and an MOD raw material. As the sol-gel raw material, a raw material having a crystallization temperature lower than that of the MOD raw material and a crystal nucleus formation rate and a crystal growth rate higher than those of the MOD raw material is selected.

The sol-gel raw material may be prepared as described below. Metal alkoxides having four or less carbon atoms are mixed and subjected to hydrolysis and polycondensation. A strong M-O-M-O . . . bond is formed by hydrolysis and polycondensation. The resulting M-O-M bond has a structure similar to the ceramic crystal structure (perovskite structure). M represents a metal element (Bi, Ti, La, or Pb, for example), and O represents oxygen. A solvent is added to the product obtained by hydrolysis and polycondensation to obtain a raw material. The sol-gel raw material is prepared in this manner.

As examples of the MOD raw material, a polynuclear metal complex raw material in which constituent elements of the ceramic film are continuously connected either directly or indirectly can be given. As specific examples of the MOD raw material, a metal salt of a carboxylic acid can be given. As examples of the carboxylic acid, acetic acid, 2-ethylhexanoic acid, and the like can be given. As examples of the metal, Bi, Ti, La, Pb, and the like can be given. The MOD raw material includes an M-O bond in the same manner as the sol-gel raw material. However, the M-O bond does not form a continuous bond differing from the sol-gel raw material obtained by polycondensation. Moreover, the bond structure is similar to the linear structure and completely differs from the perovskite structure.

In the raw material 30, the sol-gel raw material or the MOD raw material may be adjusted to the stoichiometric composition of the complex oxide, and the mixture of the raw materials may include the metal material (Pb or Bi, for example) included in the complex oxide in at most 5% excess amount with respect to the stoichiometric composition. For example, since the metal material such as Pb or Bi bonds to oxygen at low temperature and vaporizes, 10% to 20% of Bi or Pb is included in the raw material 30 as an excess additive in a conventional method in order to compensate for shortages during the crystallization process. However, the residual excess additive remaining after the crystallization may enter between the crystals of a ceramic film 40 or between the crystal and the electrode, thereby causing the crystal quality to deteriorate.

In the manufacturing method of the present embodiment, since the sol-gel raw material in which the element arrangement is similar to that of the crystal is mixed in advance with the MOD raw material in which the constituent elements easily move freely, these raw materials complementarily function during crystallization, whereby the amount of excess additive such as Pb or Bi can be reduced as much as possible. In more detail, the amount of excess additive can be reduced to 5% or less of the stoichiometric composition. This can prevent the excess additive such as Pb or Bi remaining after crystallization of the raw material 30 from entering between the crystals or between the lower electrode 20 and the crystal to form an affected layer.

In addition to the complex oxide, a paraelectric material having a catalytic effect on the complex oxide may be present in the raw material 30 in a mixed state. If the paraelectric material is present in the raw material 30 in addition to the complex oxide which makes up a ferroelectric, a part of the constituent elements of the complex oxide is replaced by the constituent element of the paraelectric material during the crystallization process of the complex oxide, whereby the crystallization temperature can be reduced.

As the paraelectric material, an oxide which includes Si or Ge in the constituent elements or an oxide which includes Si and Ge in the constituent elements may be used, for example. As such an oxide, a paraelectric material shown by $ABO_x$ or $BO_x$ in which the A site includes a single element or a composite element of Pb, Bi, Hf, Zr, V, or W and the B site includes a single element or a composite element of Si or Ge may be used. Specific examples include PbSiO ($Pb_5Si_3O_x$ or $Pb_2Si_1O_x$), PbGeO ($Pb_5Ge_3O_x$ or $Pb_2Ge_1O_x$), BiSiO ($Bi_4Si_3O_x$ or $Bi_2Si_1O_x$), BiGeO ($Bi_4Ge_3O_x$ or $Bi_2Si_1O_x$) $ZrGeO_x$, $HfGeO_x$, $VGeO_x$, $WGeO_x$, $VSiO_x$, $WSiO_x$, and the like. In the case of using Zr, Hf, V, or W in the A site, occurrence of oxygen vacancy in the ferroelectric is reduced.

The raw material 30 is dried and presintered, if necessary.

Figure 1C:
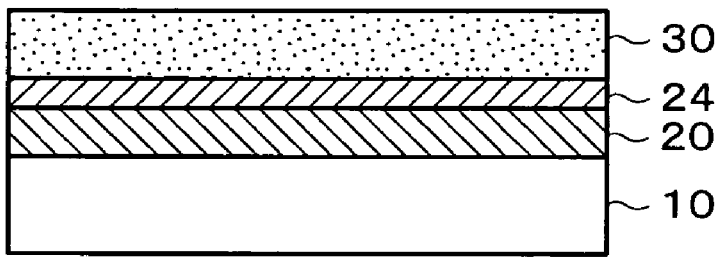
Figure 1D:
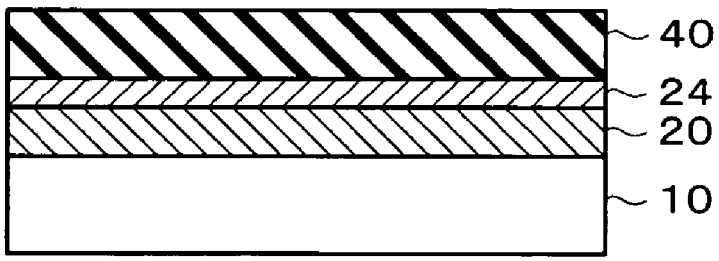

As shown in FIGS. 1C and 1D, the raw material 30 is crystallized by heating the raw material 30 to form the ceramic film 40. The sol-gel raw material generally has a crystallization temperature lower than that of the MOD raw material. The crystal nucleus formation rate and the crystal growth rate of the sol-gel raw material are higher than those of the MOD raw material. Therefore, in the crystallization process of the raw material 30 which is the mixture of these materials, crystallization of the sol-gel raw material proceeds prior to crystallization of the MOD raw material, whereby the MOD raw material remains in the gap between the crystal nuclei formed by the sol-gel raw material. The MOD raw material is crystallized in the gap between the crystal nuclei of the sol-gel raw material, whereby the gap is filled with the MOD raw material. The sol-gel raw material differs from the MOD raw material in the direction in which the crystals tend to be oriented. Therefore, the sol-gel raw material and the MOD raw material interrupt the growth of the other in the crystallization process of these raw materials, whereby microcrystals are grown. As a result, the resulting ceramic film 40 has an excellent surface morphology.

In the manufacturing method of the present embodiment, the temperature raising process of the heat treatment is performed at a pressurized state of two atmospheres or more in the low temperature region of 100° C. or less. It is known that Pb in a PbZrTiO (hereinafter called "PZT") complex oxide bonds to oxygen at a comparatively low temperature and easily scatters into the atmosphere (see "Electrochemistry Handbook", fourth edition, page 128, Maruzen, 1985), for example. The manufacturing method of the present embodiment aims at preventing such a metal material from scattering into the atmosphere. In the heat treatment, the atmosphere may be pressurized to two atmospheres or more before raising the temperature.

In the present embodiment, since the metal material can be prevented from bonding to oxygen and being released by performing the heat treatment in an atmosphere containing oxygen at a volume ratio of 10% or less, the effect of preventing scattering of the metal material due to pressurization can be further increased.

In the heat treatment, the temperature raising process may be performed at a pressurized state with respect to the atmospheric pressure, and the temperature lowering process may be performed at a reduced pressure state with respect to the pressurized state. This can prevent the metal material from being removed from the raw material due to pressurization during the temperature raising process, and can prevent adhesion of impurities contained in the atmosphere such as an excess material to the ceramic film and formation of an affected layer in the ceramic film in the temperature lowering process by reducing the pressure from the pressurized state.

The method of the present embodiment is also effective for crystallization of a complex oxide including Bi, such as BiLaTiO (hereinafter called "BLT"), BiTiO (hereinafter called "BIT"), or SrBiTaO (hereinafter called "SBT") complex oxide, which bonds to oxygen in a low temperature region and easily scatters into the atmosphere in the same manner as Pb.

In the above heat treatment, a lower alloy film 24 may be formed between the lower electrode 20 and the ceramic film 40 during the temperature raising process. The lower alloy film 24 is formed of an alloy of the metal element which makes up the lower electrode 20 and the metal element contained in the raw material 30. In this case, the metal material additive such as Pb or Bi contained in the raw material 30 in an amount excessive to the stoichiometric composition of the complex oxide becomes the material for the lower alloy film 24.

In PZT, in the case of selecting Pt as the material for the lower electrode 20, since the lattice constant (a, b and c: 3.96) of the lower electrode 20 does not coincide with the lattice constant (a, b: 4.04, c: 4.14) of the ceramic film 40, strain caused by lattice mismatch occurs at the interface. Since the strain affects the fatigue characteristics of the ferroelectric capacitor and the like, it is preferable that the strain be reduced as much as possible. As a substance having a lattice constant close to the lattice constant of the PZT ceramic film 40, $PbPt_3$ (a, b, c: 4.05) can be given. As alloy compounds made of Pb and Pt, PbPt (a, b: 4.24, c: 5.48), $Pb_2Pt$ (a, b: 6.934, c: 5.7 64), and $Pb_4Pt$ (a, b: 6.64, c: 5.97) can be given in addition to $PbPt_3$. Since the lattice constant (a, b, c: 4.05) of $PbPt_3$ has a small mismatch with the lattice constant (a, b: 4.04, c: 4.14) of the PZT ceramic film 40, $PbPt_3$ is suitable as the material for the lower alloy film 24. In view of the above description, it is necessary for Pb suitable for the lower alloy film 24 to have a high valence number. An oxide of Pb having a high valence number such as $PbO_2$ or $Pb_3O_4$ tends to vaporize at a temperature region lower than the crystallization temperature of the raw material 30. Specifically, it is necessary to perform the formation process of the lower alloy film 24 in the low temperature region in order to effectively use the metal material having a high valence number.

In the heat treatment of the present embodiment, the lower alloy film 24 is formed between the lower electrode 20 and the raw material 30 during crystallization as shown in FIG. 1C in a low temperature region of about 100° C. to 200° C. by raising the temperature at a low temperature raising rate of 100° C./min or less. The strain caused by lattice mismatch at the interface between each layer is reduced by the presence of the lower alloy film 24, thereby contributing to improvement of the surface morphology of the ceramic film 40 after crystallization and to improvement of the fatigue characteristics of the resulting ferroelectric capacitor.

In the heat treatment, the raw material 30 is crystallized by raising the temperature after the formation process of the lower alloy film 24 to form the ceramic film 40 over the lower alloy film 24.

As described above, in the method of manufacturing the ferroelectric capacitor of the present embodiment, the heat treatment for crystallization of the raw material 30 includes the formation process of the lower alloy film 24 which improves lattice mismatch at the interface between the ceramic film 40 and the lower electrode 20.

Figure 1E:
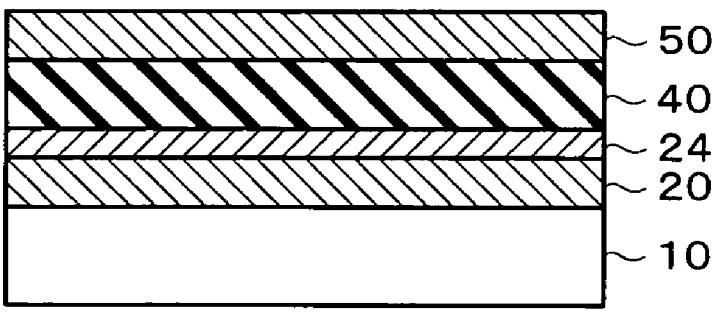

As shown in FIG. 1E, an upper electrode 50 is formed over the ceramic film 40 to obtain a ferroelectric capacitor. As the material and the formation method for the upper electrode 50, the material and the formation method for the lower electrode 20 may be applied.

As described above, according to the method of manufacturing a first ferroelectric capacitor of the present embodiment, the complex oxide material can be prevented from being removed into the atmosphere by the heat treatment in the pressurized and low oxygen state. Moreover, since the lower alloy film 24 can be formed in a low temperature region during the temperature raising process of the heat treatment, the surface morphology can be improved and the electrical characteristics of the capacitor can be improved by reducing the strain at the interface of the ceramic film 40 by utilizing the lower alloy film 24.

In the method of manufacturing a first ferroelectric capacitor of the present embodiment, after forming the upper electrode 50 over the substrate 10, a heat treatment for recovering he ferroelectric characteristics may be performed at a pressure of two atmospheres or more as post annealing. This enables the interfacial state between the ceramic film 40 and the upper electrode 50 and the lower electrode 20 to be improved, whereby the ferroelectric characteristics can be recovered.

In the method of manufacturing a first ferroelectric capacitor of the present embodiment, the ferroelectric capacitor may be patterned by etching or the like after forming the upper electrode 50 over the substrate 10, and a heat treatment for recovering the ferroelectric characteristics may be performed at a pressure of two atmospheres or more as post annealing. This enables the ferroelectric capacitor to recover from process damage in the etching step.

The post annealing may be performed by slowly heating the ferroelectric capacitor using furnace annealing (FA), or by rapidly heating the ferroelectric capacitor using a rapid thermal annealing method.

The above-described heat treatment may be performed in an atmosphere such as a gas, such as nitrogen, argon, or xenon, inert to vaporization of the metal material which makes up the complex oxide. The effect of reducing vaporization of the metal material which makes up the complex oxide can be further increased by performing the heat treatment in such an atmosphere.

Pressurization in a plurality of stages may be performed in at least either the temperature raising process or the temperature lowering process during the heat treatment.

A further detailed example of the manufacturing method according to the present embodiment is described below with reference to the drawings.

EXAMPLE 1

In this example, $Pb(Zr_{0.35},Ti_{0.65})O_3$ was deposited over a given substrate on which a Pt electrode was formed by using a spin coating method, and an examination was conducted.

In this example, a raw material solution, in which Pb was added to a mixture of a sol-gel solution and a MOD solution adjusted to the stoichiometric composition of PZT (Zr/Ti=35/65) in an amount of 5% excess at a molar ratio, was used. The Pb additive was used to form $PbPt_3$ at the interface between the Pt electrode and the PZT film.

Figure 2:
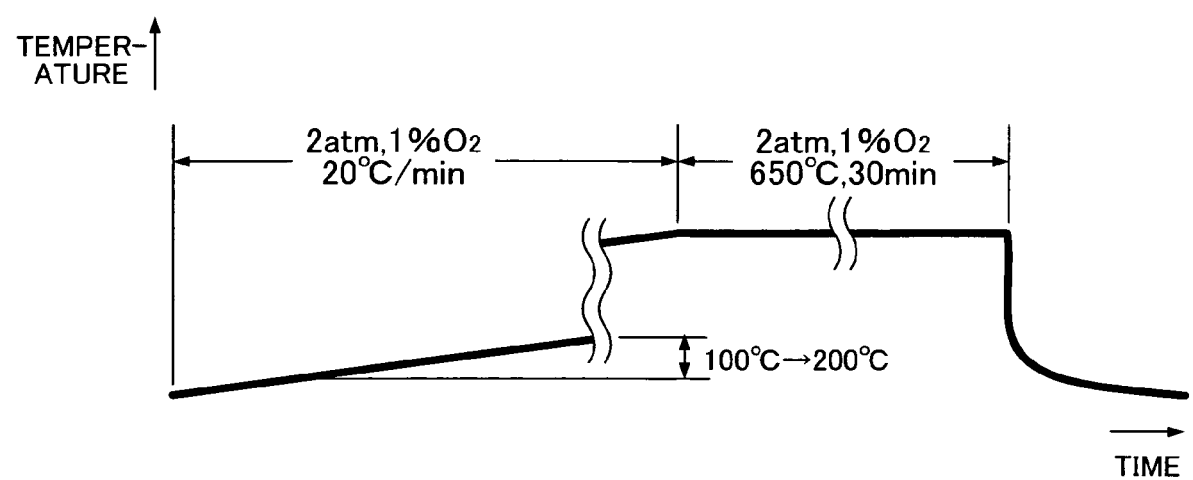
FIG. 2 shows a heat treatment in manufacturing steps of an example 1.

The raw material solution was applied to the Pt electrode by spin coating (3000 rpm, 30 sec) and presintered at 400° C. for five minutes. This step was repeated three times to form a raw material with a thickness of 150 nm on the Pt electrode. As shown in FIG. 2, the raw material was heated to 650° C. by furnace annealing (FA) in an atmosphere which was pressurized to two atmospheres and contained oxygen in an amount of 1% at a volume ratio, and crystallized by heating the raw material for 30 minutes to obtain a PZT film having a perovskite structure. In the temperature raising process, the temperature raising rate was set at 20° C./min in order to form a $PbPt_3$ film which is an alloy of Pt of the Pt electrode and Pb in the raw material in a low temperature region of about 100° C. to 200° C.

Figure 3:
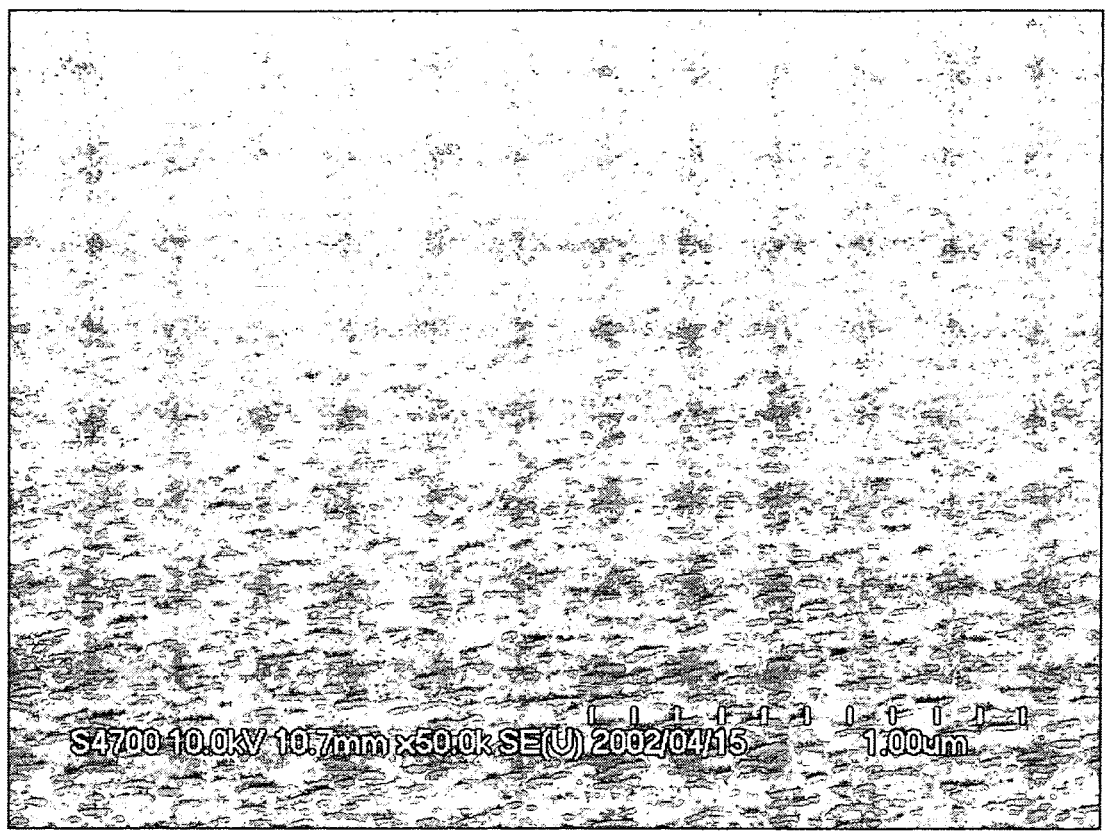
FIG. 3 is a micrograph of a ceramic film according to an example 1.

FIG. 3 is a micrograph of the surface of the resulting PZT film. As shown in FIG. 3, microcrystals having an average particle diameter of about 50 nm are uniformly distributed, and the surface morphology is excellent. This is considered to be because lattice mismatch at the interface was reduced by the $PbPt_3$ layer formed at the interface between the Pt electrode and the PZT film, and removal of Pb during crystallization of the PZT film was prevented by the heat treatment performed under conditions of the pressurized state and the low oxygen concentration state.

Figure 4:
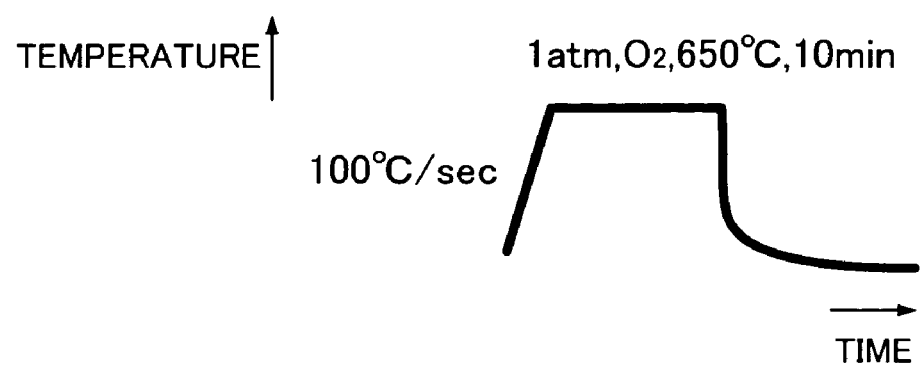
FIG. 4 shows a heat treatment in manufacturing steps of a comparative example 1.
Figure 5C:
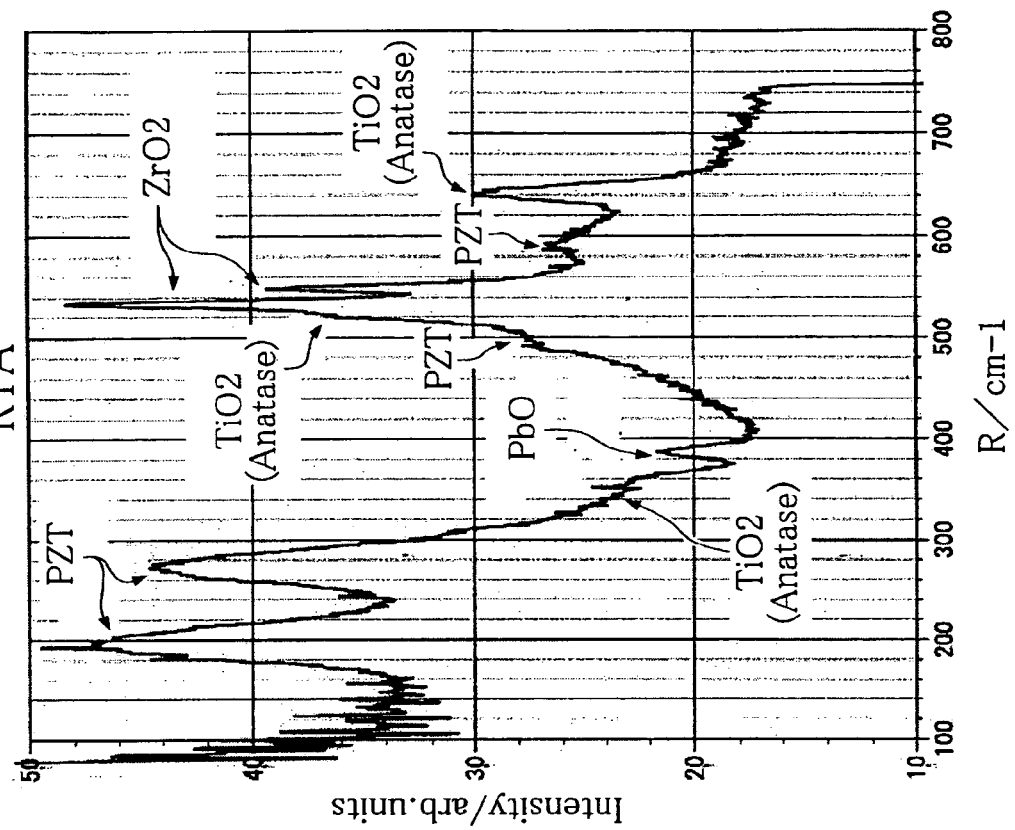
FIGS. 5B and 5C show a Raman scattering spectrum of a ceramic film according to the comparative example 1.
Figure 5A:
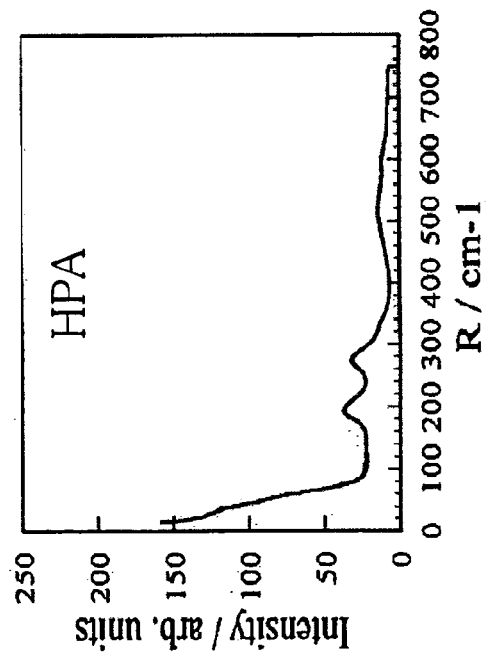
FIG. 5A shows a Raman scattering spectrum of a ceramic film according to the example 1.
Figure 5B:
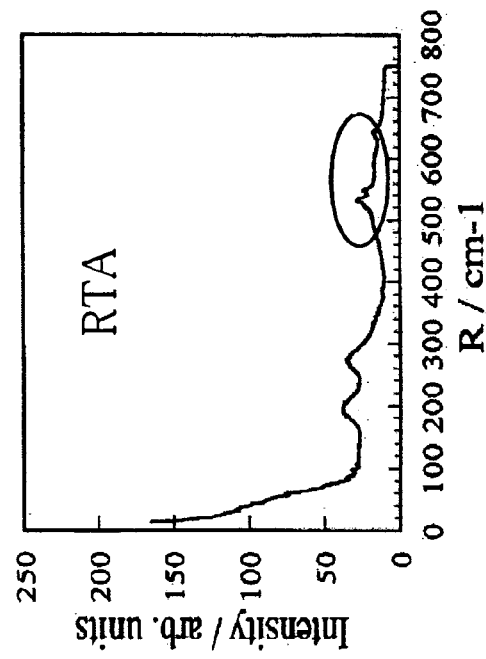

The Raman scattering spectrum of the PZT film was measured. In order to allow comparison with the prior art in this measurement, the Raman scattering spectrum of a PZT film, which was crystallized by performing a heat treatment using a thermal annealing method in air without pressurization as shown in FIG. 4 (hereinafter called "comparative example 1"), was also measured. As shown in FIGS. 5A and 5B, the spectrum shape differs between the PZT film according to the manufacturing method of this example and the PZT film of the comparative example 1 at 500 R/cm$^{-1}$ to 700 R/cm$^{-1}$. This is because the hetero-phase is formed in the PZT film of the comparative example 1. FIG. 5C is an enlarged view of the spectrum shape at 100 R/cm$^{-1}$ to 800 R/cm$^{-1}$ in the measurement result for the PZT film of the comparative example 1. As shown in FIG. 5C, peaks indicating occurrence of a hetero-phase and an affected layer of PZT are observed in the PZT film of the comparative example 1. The reason why such a significant difference was observed is considered to be because variation of the composition during the PZT crystallization process was decreased by reducing generation of vapor of Pb by the heat treatment in a pressurized and low oxygen concentration state.

In this example, a Pt electrode was formed on the crystallized PZT film as an upper electrode, and post annealing was performed at two atmospheres to obtain a ferroelectric capacitor. The ferroelectric characteristics of the ferroelectric capacitor were then evaluated.

Figure 6:
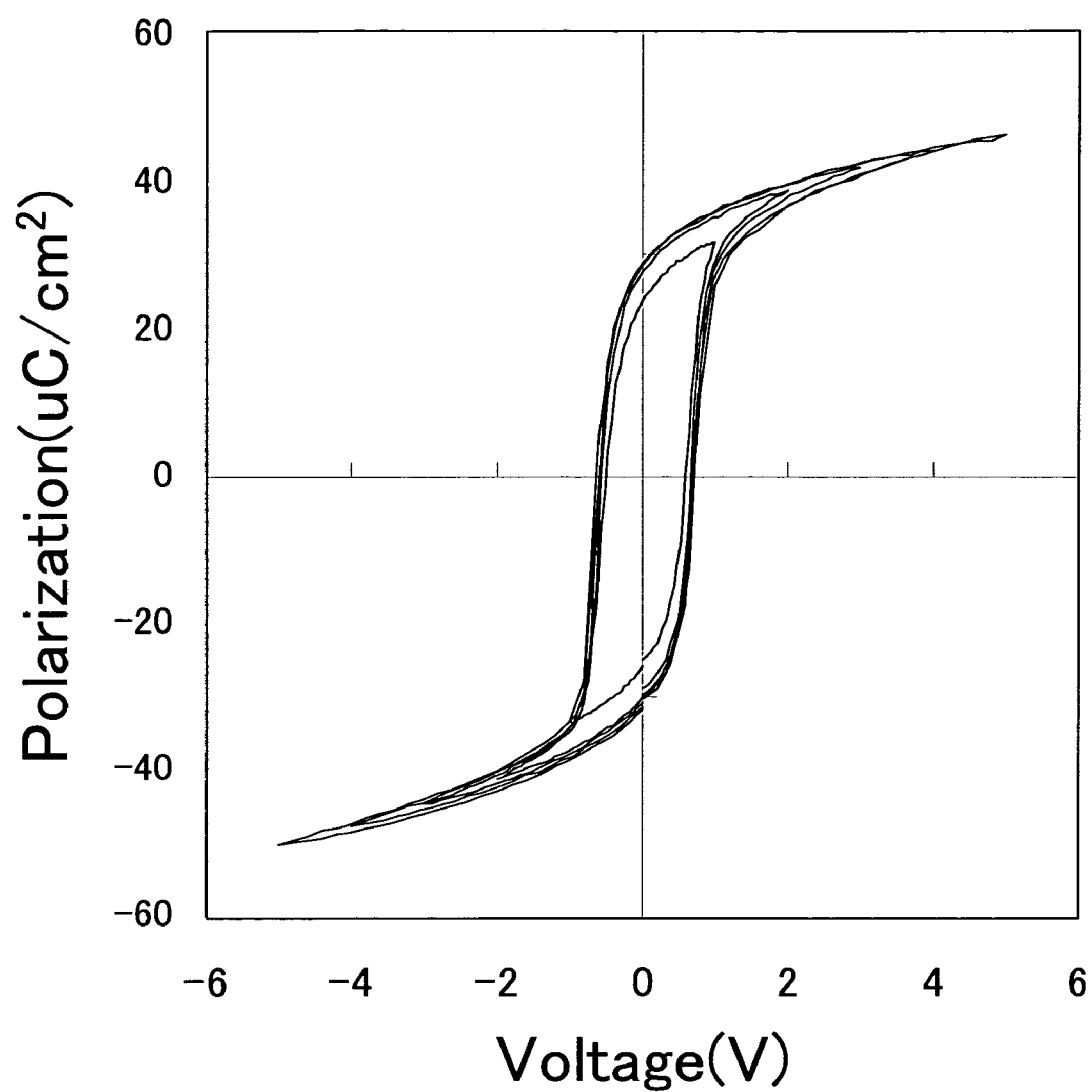
FIG. 6 shows hysteresis characteristics of a ferroelectric capacitor according to the example 1.

FIG. 6 shows hysteresis characteristics of the ferroelectric capacitor obtained by the manufacturing method of this example. As shown in FIG. 6, the ferroelectric capacitor of this example had a hysteresis shape with excellent squareness which is saturated at a low voltage of 2 V or less. The ferroelectric capacitor showed excellent polarization characteristics with a polarization Pr of about 30 µC/cm$^2$.

Figure 7A:
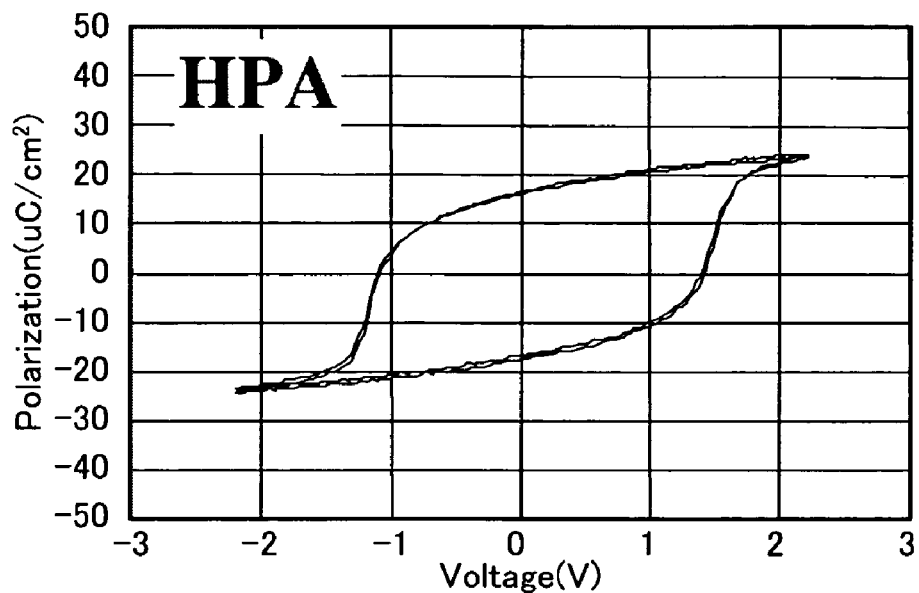
FIG. 7A shows hysteresis characteristics of a ferroelectric capacitor according to the example 1.
Figure 7B:
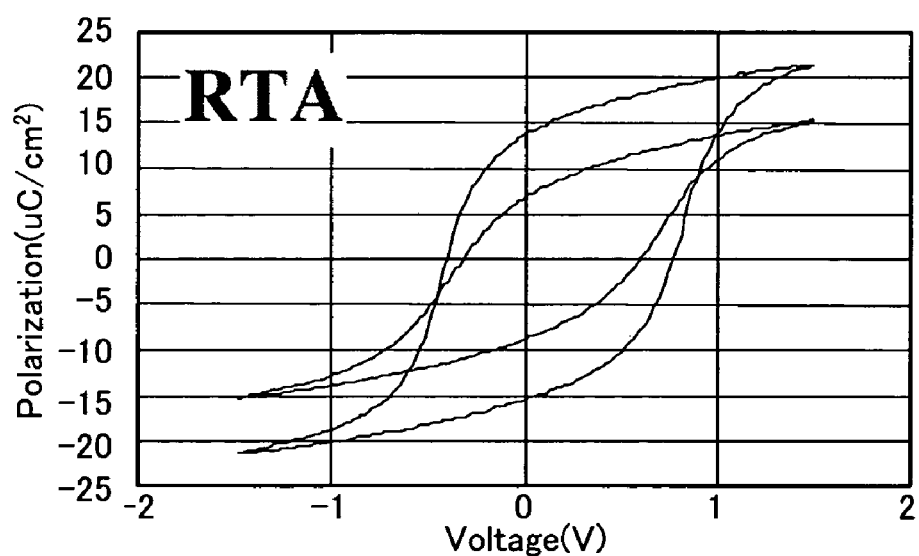
FIG. 7B shows hysteresis characteristics of a ferroelectric capacitor according to the comparative example 1.

The fatigue characteristics of the ferroelectric capacitor obtained by the manufacturing method of this example and a ferroelectric capacitor obtained by forming an upper electrode on the PZT film obtained by the manufacturing method of the comparative example 1 were examined. FIGS. 7A and 7B show the hysteresis characteristics before and after the fatigue test in which a triangular wave pulse at 2 V and 66 Hz was applied to the ferroelectric capacitors ten times and a rectangular wave pulse at 1.5 V and 500 kHz was applied 10$^8$ times or more to cause polarization reversal. FIG. 7A shows the hysteresis characteristics of the ferroelectric capacitor obtained by the manufacturing method of this example. FIG. 7B shows the hysteresis characteristics of the ferroelectric capacitor obtained by the comparative example 1. As shown in FIG. 7A, no change in hysteresis shape is observed for the ferroelectric capacitor obtained by this example before and after the test. On the contrary, as shown in FIG. 7B, the polarization characteristics of the ferroelectric capacitor obtained by the comparative example 1 decreased in the hysteresis shape after the test. This shows that the strain caused by lattice mismatch is reduced at the interface between the PZT film and the lower electrode, since the manufacturing method of this example includes the formation process of the $PbPt_3$ alloy film in the crystallization process of the PZT film.

As described above, it was confirmed that the manufacturing method of the present embodiment enables the ceramic film to have an excellent surface morphology by the heat treatment including the formation process of the lower alloy film in a pressurized and low oxygen concentration state in the crystallization step of the ceramic film, and the ferroelectric capacitor including the ceramic film has excellent hysteresis characteristics and excellent fatigue characteristics.

EXAMPLE 2

In this example, characteristics of PZT films formed on a Pt electrode using a spin coating method were examined for the case where a mixture of a sol-gel solution and an MOD solution was used as the raw material solution, the case where only a sol-gel solution was used as the raw material solution (comparative example 2), and the case where only an MOD solution was used as the raw material solution (comparative example 3). A raw material solution adjusted to the stoichiometric composition of PZT (Zr/Ti=35/65) to which Pb was added so that the amount of Pb was 5% excess at a molar ratio was used. The heat treatment for crystallization was performed by increasing the temperature of a raw material to which the raw material solution was applied to 650° C. by furnace annealing (FA) in an atmosphere which was pressurized to two atmospheres and contained oxygen in an amount of 1% at a volume ratio, and heating the raw material for 30 minutes.

Figure 8A:
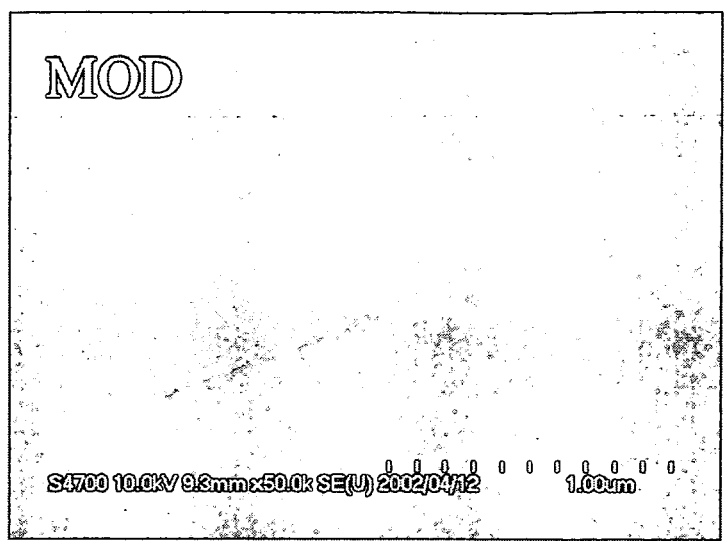
FIG. 8A is a micrograph of a ceramic film according to a comparative example 3.
Figure 8B:
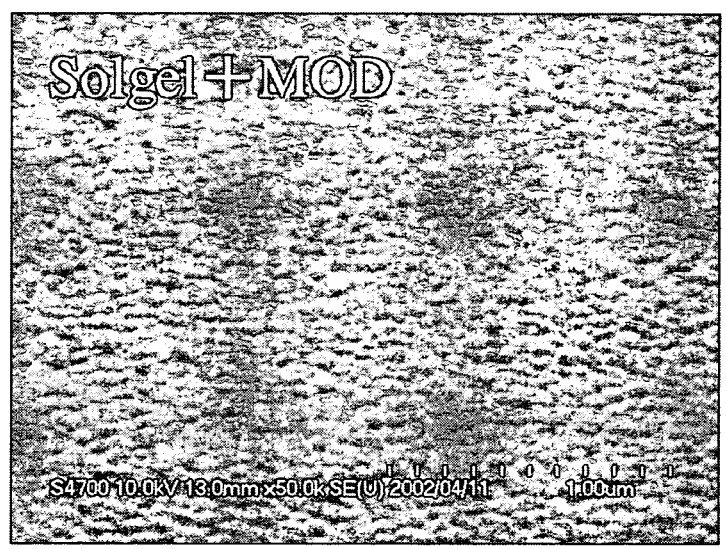
FIG. 8B is a micrograph of a ceramic film according to an example 2.
Figure 8C:
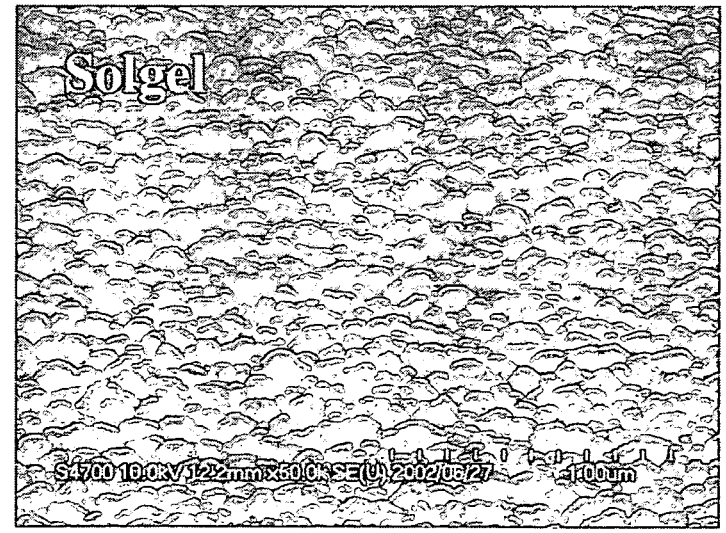
FIG. 8C is a micrograph of a ceramic film according to a comparative example 2.

FIGS. 8A to 8C are micrographs showing the surfaces of the PZT films obtained in this example and the comparative examples 2 and 3. FIG. 8A shows surface morphology of the PZT film of the comparative example 3 in which only the MOD solution was used as the raw material solution. FIG. 8B shows surface morphology of the PZT film of this example in which the mixture of the sol-gel solution and the MOD solution was used as the raw material solution. FIG. 8C shows surface morphology of the PZT film of the comparative example 2 in which only the sol-gel solution was used as the raw material solution.

In the micrographs shown in FIGS. 8A to 8C, the grain size is small in the case where the mixture of the sol-gel solution and the MOD solution was used in comparison with the case where only the MOD solution (comparative example 3) or only the sol-gel solution (comparative example 2) was used, whereby a surface morphology in which microcrystals are uniformly distributed is obtained.

In this example, the characteristics of the PZT film in which the mixture of the sol-gel solution and the MOD solution was used as the raw material solution were examined while changing the mixing ratio of the sol-gel solution and the MOD solution to 2:1, 1:1, and 1:2 at a molar ratio.

Figure 9C:
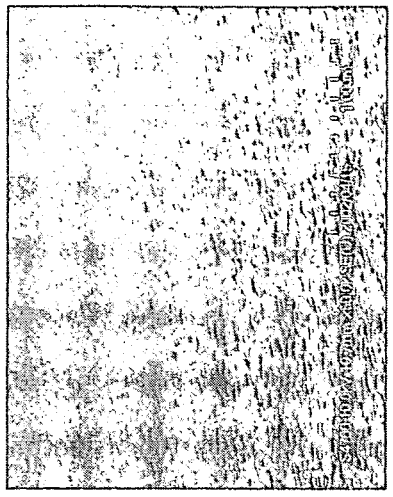
FIGS. 9B to 9D are micrographs of a ceramic film according to the example 2.
Figure 9B:
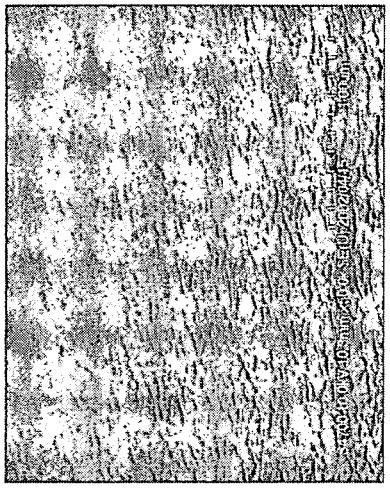
Figure 9E:
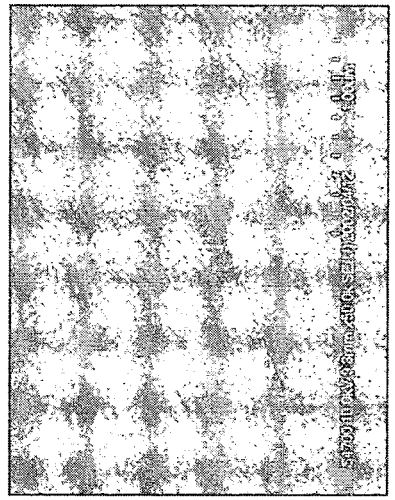
FIG. 9E is a micrograph of a ceramic film according to the comparative example 3.
Figure 9A:
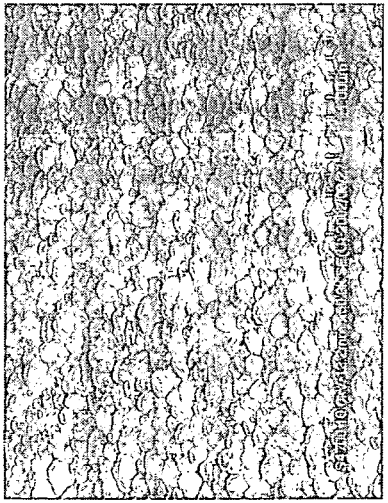
FIG. 9A is a micrograph of a ceramic film according to the comparative example 2.
Figure 9D:
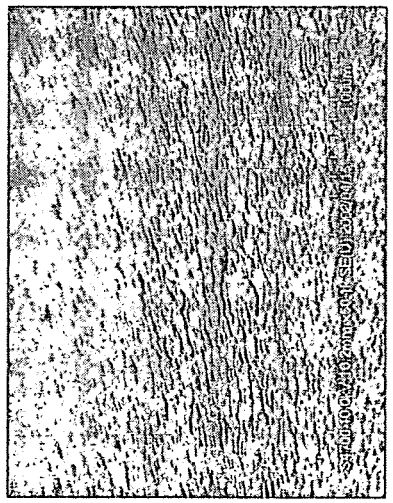

FIGS. 9A to 9E are micrographs of the surface of the PZT film obtained in this example. FIGS. 9A and 9E show micrographs of a PZT film obtained by using only the sol-gel solution as the raw material solution (comparative example 2) and a PZT film obtained by using only the MOD solution as the raw material solution (comparative example 3) as comparative examples of the PZT film of this example.

As shown in FIGS. 9A to 9E, the average particle size of the PZT film of this example obtained by using the mixture of the sol-gel solution and the MOD solution is as small as 30 to 70 nm. On the contrary, the average particle size of the PZT film of the comparative example 2 obtained by using only the sol-gel solution is as large as 100 nm, and the average particle size of the PZT film of the comparative example 2 obtained by using only the MOD solution is as large as 2 µm. Specifically, an excellent surface morphology in which microcrystals are uniformly distributed is obtained in the case where the mixture of the sol-gel solution and the MOD solution was used in comparison with the case where only the sol-gel solution or the MOD solution was used. The formation density of initial crystal nuclei differs between the case where only the sol-gel solution is used (comparative example 2) and the case where the MOD solution was used (comparative example 3). However, since crystallization proceeds according to the initial crystal nuclei, the particle size of the crystal is considered to be increased. However, in the case where the mixture of the sol-gel solution and the MOD solution is used as in this example, since the initial crystal nuclei are formed by the sol-gel solution at high density and the MOD solution is crystallized to fill the gap between the initial crystal nuclei therewith, the particle size of the crystals is considered to be reduced.

Figure 10C:
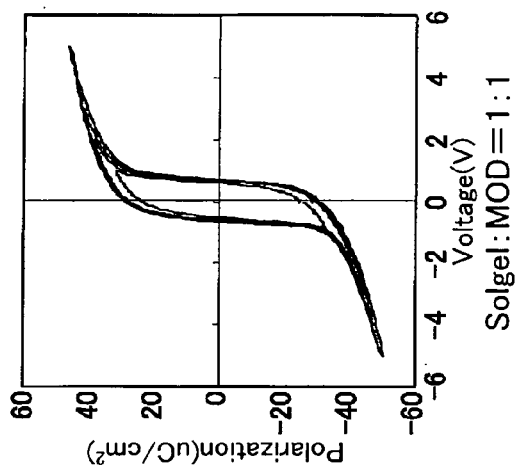
FIGS. 10B to 10D show hysteresis characteristics of a ferroelectric capacitor according to the example 2.
Figure 10B:
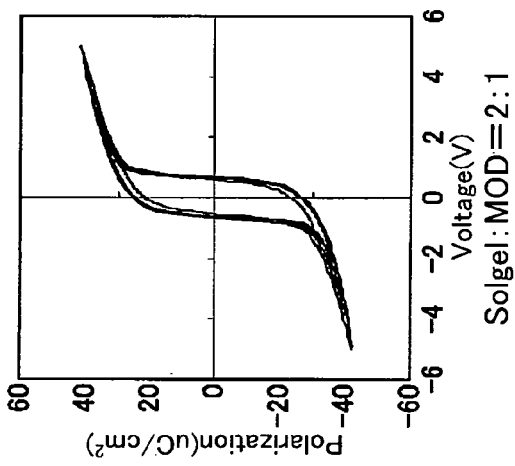
Figure 10E:
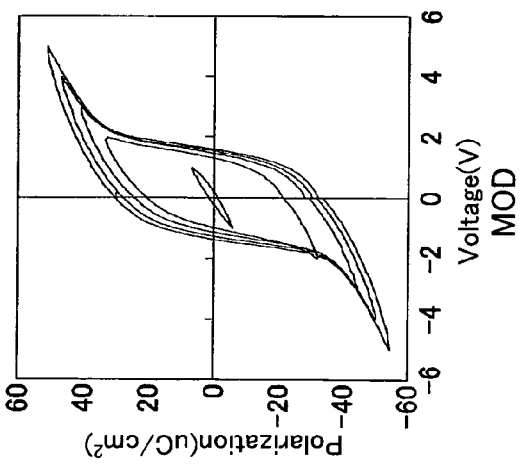
FIG. 10E shows hysteresis characteristics of a ferroelectric capacitor according to the comparative example 3.
Figure 10A:
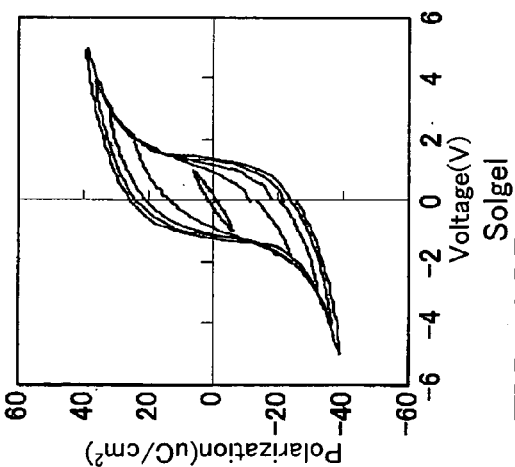
FIG. 10A shows hysteresis characteristics of a ferroelectric capacitor according to the comparative example 2.
Figure 10D:
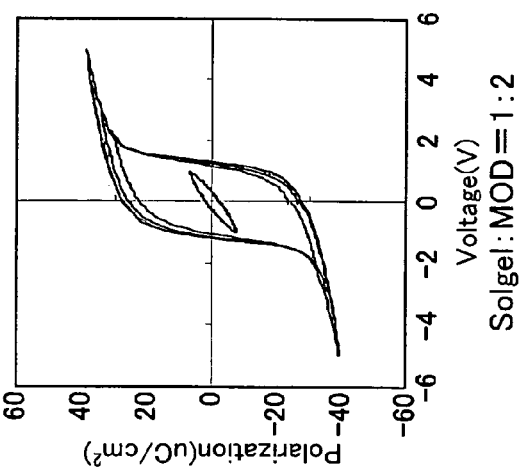

Electrical characteristics of a ferroelectric capacitor obtained by forming an upper electrode on the above PZT film were examined. FIGS. 10B to 10D show hysteresis characteristics of the ferroelectric capacitors obtained in this example. FIG. 10A shows hysteresis characteristics of the ferroelectric capacitor of the comparative example 2 in which only the sol-gel solution was used. FIG. 10E shows hysteresis characteristics of the ferroelectric capacitor of the comparative example 3 in which only the MOD solution was used.

As shown in FIGS. 10A to 10E, a hysteresis shape with excellent squareness which is saturated at a low voltage of 2 V or less was obtained for the ferroelectric capacitor of this example in which the mixture of the sol-gel solution and the MOD solution was used as the raw material solution at any mixing ratio in comparison with the ferroelectric capacitor of the comparative example 2 in which only the sol-gel solution was used as the raw material solution or the ferroelectric capacitor of the comparative example 3 in which only the MOD solution was used as the raw material solution. The characteristics of the PZT film in which the mixture of the sol-gel solution and the MOD solution was used as the raw material solution were examined while changing the mixing ratio of the sol-gel solution and the MOD solution to 2:1, 1:1, and 1:2 at a molar ratio.

Therefore, according to this example, it was confirmed that the surface morphology of the ceramic film can be improved and the ferroelectric capacitor having a hysteresis shape with an excellent squareness can be manufactured when the mixing ratio of the sol-gel solution and the MOD solution in the raw material solution was 1:2 to 2:1 at a molar ratio.

In this example, the temperature characteristics of the ferroelectric capacitor including the PZT film obtained by using the mixture of the sol-gel solution and the MOD solution (mixing ratio: 1:1) were examined. The temperature characteristics were measured by measuring the hysteresis characteristics at 25° C. to 100° C. The results are shown in FIGS. 11A to 11D. As shown in FIGS. 11A to 11D, it was confirmed that the ferroelectric capacitor obtained by using the manufacturing method of this example has excellent temperature characteristics in which almost no change in hysteresis shape was observed even at a high temperature of 100° C.

Figure 12:
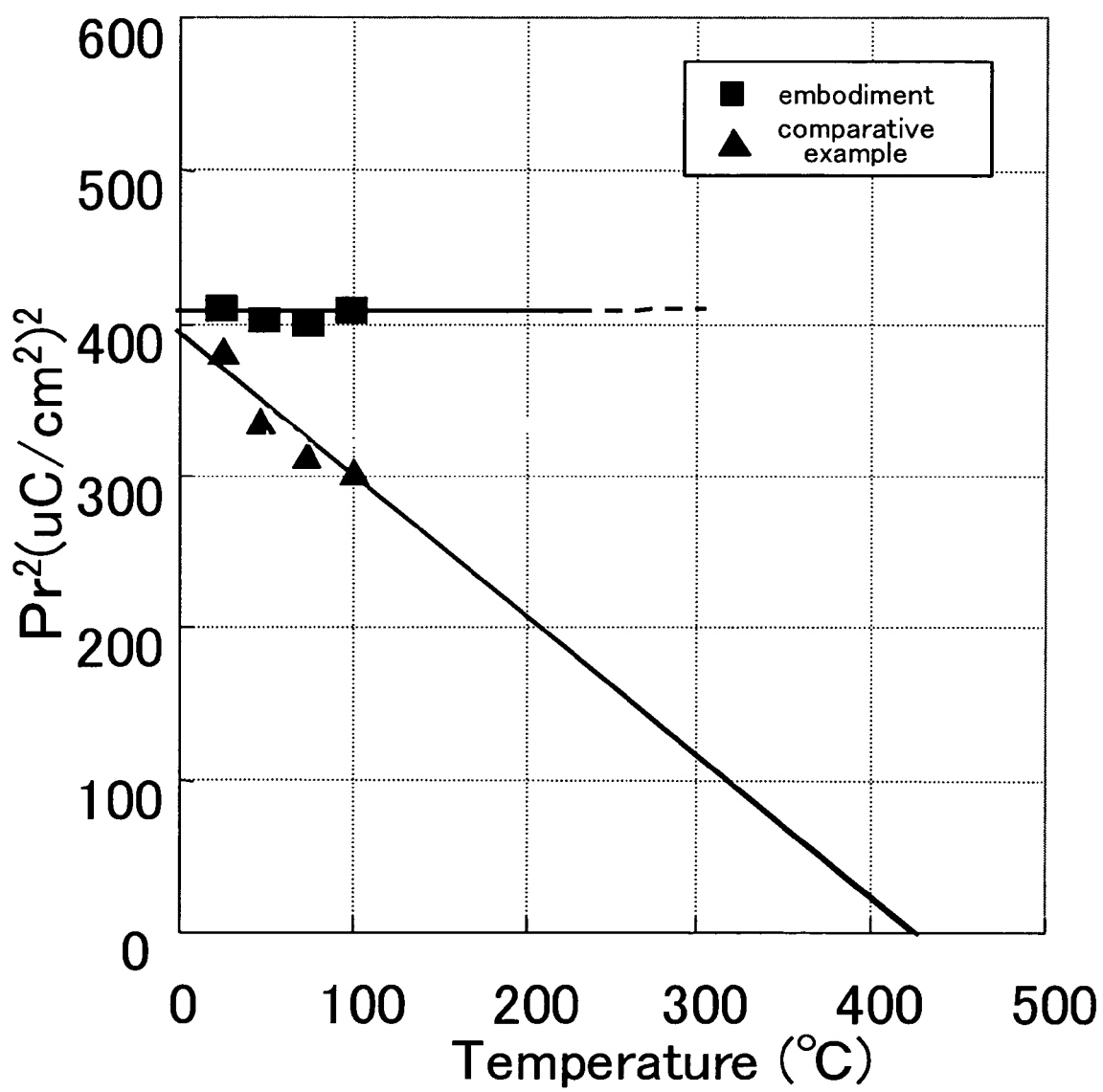
FIG. 12 shows temperature characteristics of ferroelectric capacitors according to the example 2 and a comparative example.

FIG. 12 is a graph in which the normalized polarization $Pr^2$ $[(\mu C/cm^2)^2]$ and the temperature (° C.) are respectively plotted on the vertical axis and the horizontal axis based on the above results. As shown in FIG. 12, the polarization of the ferroelectric capacitor including the PZT film formed in the comparative example deteriorates as the temperature increases. On the contrary, the ferroelectric capacitor including the PZT film formed by the method of this example is almost constant even if the temperature changes, whereby excellent temperature characteristics the same as those of the bulk PZT were obtained.

EXAMPLE 3

In this example, Zr/Ti ratio dependence in the $Pr(Zr,Ti)O_3$ raw material solution was examined. In the examples 1 and 2, the raw material solution in which the Zr/Ti ratio was 35/65 was used. In this example, a raw material solution in which the Zr/Ti ratio was 20/80 was used, and the electrical characteristics of ferroelectric capacitors including PZT films formed by using the mixture of the sol-gel solution and the MOD solution (mixing ratio=1:1) as the raw material solution and using only the MOD solution as the raw material solution (comparative example 4) were compared.

Figure 13A:
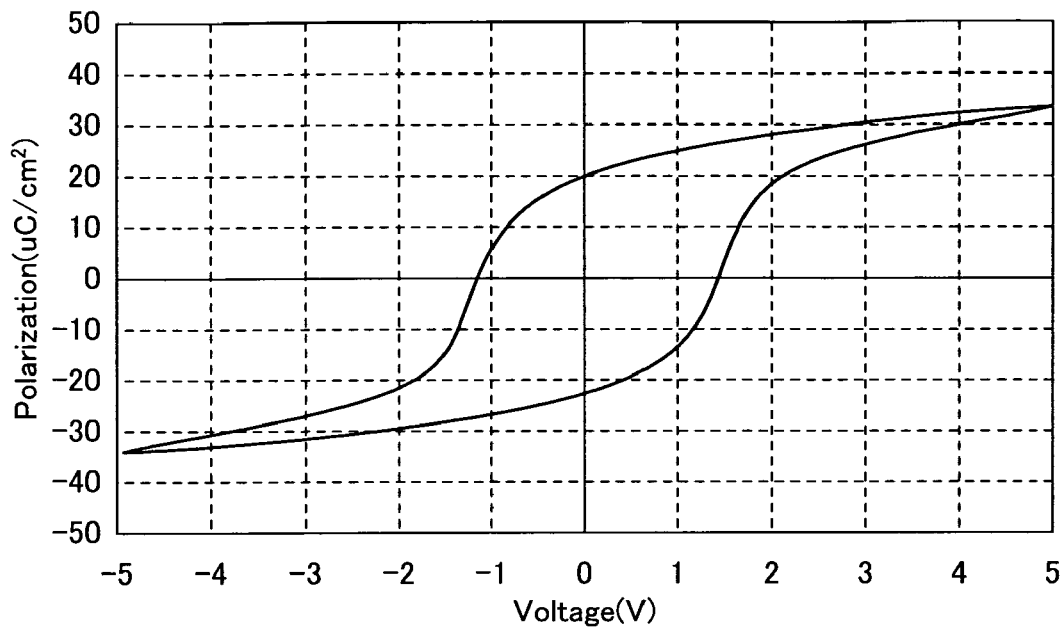
FIG. 13A shows hysteresis characteristics of a ferroelectric capacitor according to a comparative example 4.
Figure 13B:
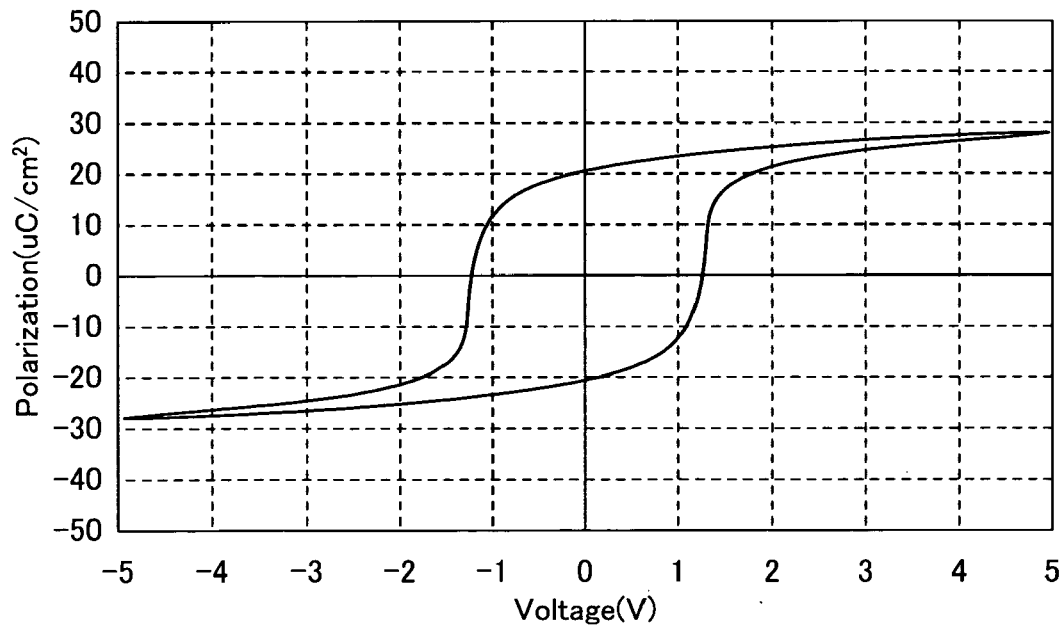
FIG. 13B shows hysteresis characteristics of a ferroelectric capacitor according to an example 3.

FIGS. 13A and 13B show hysteresis characteristics of these ferroelectric capacitors. As shown in FIGS. 13A and 13B, even in the case where the Zr/Ti ratio was 20:80, a hysteresis shape with excellent squareness which is saturated at a low voltage is obtained in this example in which the mixture of the sol-gel solution and the MOD solution was used in comparison with the comparative example 4 in which only the MOD solution was used. Specifically, according to this example, it was confirmed that the manufacturing method which uses the mixture of the sol-gel solution and the MOD solution as the raw material solution is effective even if the Zr/Ti ratio is changed.

EXAMPLE 4

In this example, the influence on the electrical characteristics of the ferroelectric capacitor was examined in the case of reducing the temperature of the heat treatment when crystallizing the PZT film to 580° C. and 425° C. in the manufacturing method described in the example 1.

Figure 14A:
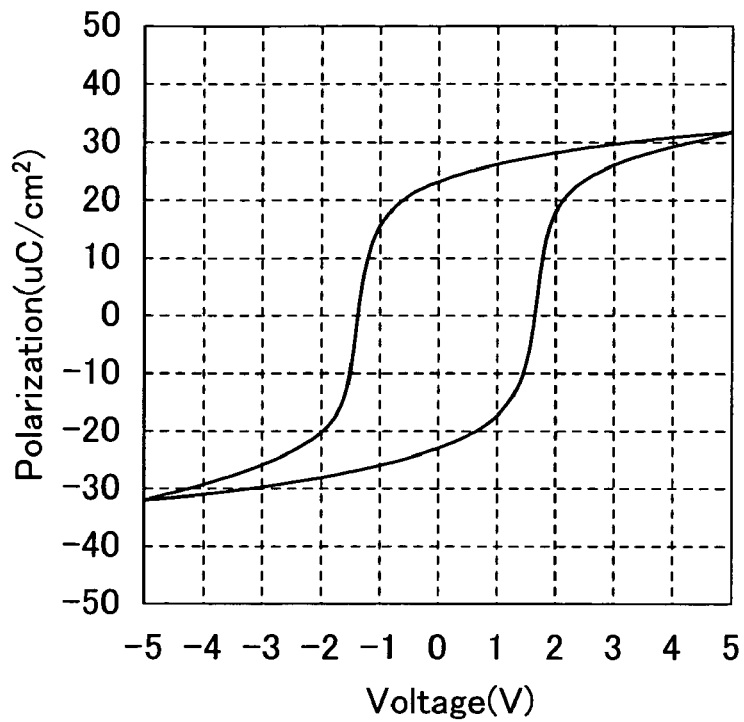
FIGS. 14A and 14B show hysteresis characteristics of a ferroelectric capacitor according to an example 4.
Figure 14B:
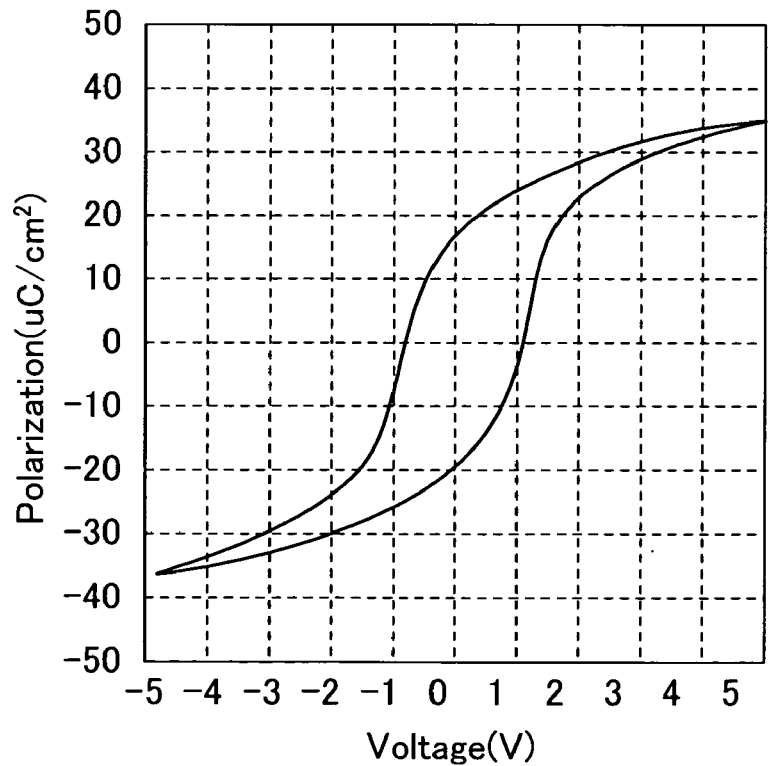

FIG. 14A shows hysteresis characteristics of the ferroelectric capacitor including a PZT film crystallized by the heat treatment at 580° C. FIG. 14B shows hysteresis characteristics of the ferroelectric capacitor including a PZT film crystallized by the heat treatment at 425° C. As shown in FIGS. 14A and 14B, it was confirmed that a ferroelectric capacitor having hysteresis characteristics sufficient for practical application can be obtained even if the crystallization temperature is decreased.

5. Method of Manufacturing Second Ferroelectric Capacitor

FIGS. 15A to 15F are cross-sectional views schematically showing manufacturing steps of a second ferroelectric capacitor according to the present embodiment. Sections having substantially the same functions as in FIG. 1 are denoted by the same symbols. Detailed description of these sections is omitted.

In the method of manufacturing a second ferroelectric capacitor according to the present embodiment, the fatigue characteristics of the ferroelectric capacitor are improved by providing a step of forming an alloy film at the upper and lower interfaces of the ceramic film, and the crystal orientation of the ceramic film is improved by crystallizing the ceramic film by using a heat treatment using a rapid thermal annealing method.

Figure 15A:
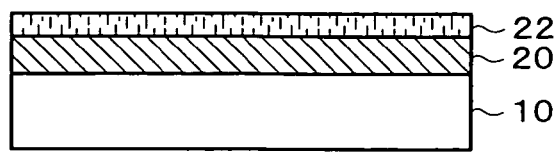
FIGS. 15A to 15F show manufacturing steps of a second ferroelectric capacitor according to an embodiment of the present invention.

In the manufacturing steps of the present embodiment, the lower electrode 20 is formed over the substrate 10 as shown in FIG. 15A. An oxide film 22 including an oxide of a metal material (Pb or Bi, for example) which makes up a complex oxide (PZT, BIT, BLT, or SBT, for example) ($PbO_2$ or $BiO_2$, for example) is formed over the lower electrode 20.

Figure 15B:
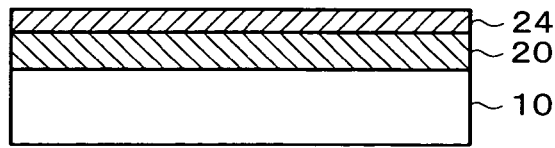

As shown in FIG. 15B, the oxide film 22 is heated at a pressure of two atmospheres or more to form the lower alloy film 24 consisting of a compound of the metal material for the lower electrode 20 (Pt or Ir, for example) and the metal material which makes up the complex oxide (Pb or Bi, for example). The heat treatment for forming the lower alloy film 24 is performed at a temperature lower than that of the heat treatment for crystallization of the ceramic film 40 described later in order to prevent the metal material which makes up the complex oxide from scattering into the atmosphere.

Figure 15C:
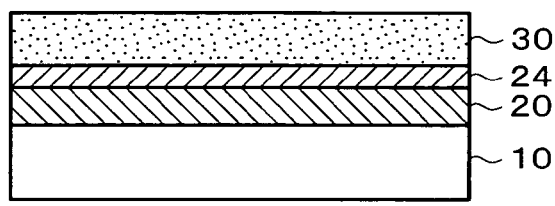

As shown in FIG. 15C, the raw material 30 is formed over the lower alloy film 24. The raw material 30 may include a sol-gel raw material and an MOD raw material in the same manner as in the first embodiment. In the raw material 30, the sol-gel raw material or the MOD raw material may be adjusted to the stoichiometric composition of the complex oxide, and the mixture of the raw materials preferably includes the metal material (Pb or Bi, for example) included in the complex oxide in at most 5% excess amount with respect to the stoichiometric composition. In the manufacturing method of the present embodiment, since the lower alloy film 24 is formed before forming the raw material 30, the metal material included in the complex oxide may not be excessively added to the raw material 30.

In addition to the complex oxide, a paraelectric material having a catalytic effect on the complex oxide may be present in the raw material 30 in a mixed state. If the paraelectric material is present in the raw material 30 in addition to the complex oxide which makes up a ferroelectric, a part of the constituent elements of the complex oxide is replaced by the constituent element of the paraelectric material during the crystallization process of the complex oxide, whereby the crystallization temperature can be reduced.

As the paraelectric material, an oxide which includes Si or Ge in the constituent elements or an oxide which includes Si and Ge in the constituent elements may be used, for example.

Figure 15D:
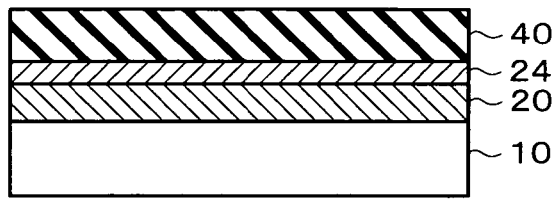

As shown in FIG. 15D, the heat treatment for crystallizing the raw material 30 is performed to form the ceramic film 40 consisting of the above complex oxide. The heat treatment is performed by using a rapid thermal annealing method which rapidly heats the raw material 30 at a temperature raising rate of several tens of degrees per second. In the crystallization process of the complex oxide, if the temperature raising rate is made low, initial crystal nuclei are formed at various angles, whereby the crystals of the ceramic film tend to be oriented at random. However, a high quality crystal film excellent in orientation can be obtained by rapidly heating the raw material 30 by using the rapid thermal annealing method as in the present embodiment.

In the heat treatment for crystallization, the temperature raising process is performed at a pressure of two atmospheres or more in the low temperature region of 100° C. or less. This aims at preventing a metal material which vaporizes at a relatively low temperature such as Pb or Bi from scattering into the atmosphere before crystallization. In the heat treatment, the atmosphere may be pressurized to two atmospheres or more before raising the temperature.

In the present embodiment, since the metal material can be prevented from bonding to oxygen and being released by performing the heat treatment in an atmosphere containing oxygen at a volume ratio of 10% or less, the effect of preventing scattering of the metal material due to pressurization can be further increased.

In the heat treatment, the temperature raising process may be performed at a pressurized state with respect to atmospheric pressure, and the temperature lowering process may be performed at a reduced pressure state with respect to the pressurized state. This can prevent the metal material from being removed from the raw material due to pressurization during the temperature raising process, and cab prevent adhesion of impurities contained in the atmosphere, such as an excess material, to the ceramic film, and formation of an affected layer in the ceramic film in the temperature lowering process by reducing the pressure from the pressurized state.

In the present embodiment, in the case where the sol-gel raw material and the MOD raw material are included in the raw material 30, the sol-gel raw material and the MOD raw material interrupt the growth of the other in the crystallization process of these raw materials, whereby microcrystals are grown. As a result, the resulting crystallized ceramic film 40 has an excellent surface morphology.

Figure 15E:
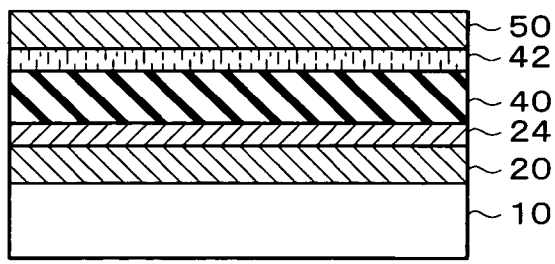

As shown in FIG. 15E, an oxide film 42 including an oxide of a metal material (Pb or Bi, for example) which makes up a complex oxide (PZT, BIT, BLT, or SBT, for example) ($PbO_2$ or $BiO_2$, for example) is formed over the ceramic film 40. The upper electrode 50 is formed over the oxide film 42. The oxide film 42 is formed in order to form an alloy film at the interface between the ceramic film 40 and the upper electrode 50.

Figure 15F:
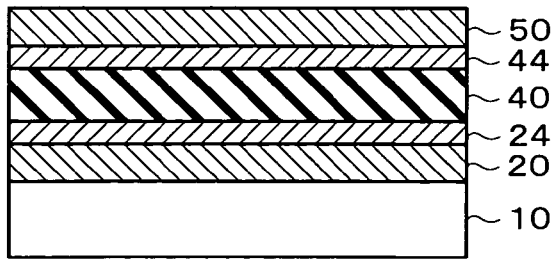

As shown in FIG. 15F, the laminate is subjected to a heat treatment at a pressure of two atmospheres or more to form an upper alloy film 44 consisting of an alloy of the metal material for the complex oxide included in the oxide film 42 (Pb or Bi, for example) and the metal material for the upper electrode 50 (Pt or Ir, for example). The upper alloy film 42 has the same function as the lower alloy film 22. Specifically, the upper alloy film 42 reduces the strain caused by lattice mismatch between the ceramic film 40 and the upper electrode 50, whereby the surface morphology of the ceramic film 40 can be improved and the fatigue characteristics of the ferroelectric capacitor can be improved.

As described above, according to the method of manufacturing the ferroelectric capacitor of the present embodiment, the complex oxide material can be prevented from being removed into the atmosphere by the heat treatment in the pressurized and low oxygen state. Moreover, since the heat treatment for crystallization is performed by using the rapid thermal annealing method, a high quality crystal film excellent in orientation can be obtained by rapid heating. Furthermore, since the heat treatment for forming the lower alloy film 24 and the upper alloy film 44 is introduced, the surface morphology can be improved and the electrical characteristics of the capacitor can be improved by reducing the strain at the interface of the ceramic film 40 by utilizing the lower alloy film 24.

In the method of manufacturing a ferroelectric capacitor of the present embodiment, after the upper electrode 50 is formed over the substrate 10, a heat treatment for recovering the ferroelectric characteristics may be performed at a pressure of two atmospheres or more as post annealing. This enables the interfacial state between the ceramic film 40 and the upper electrode 50 and the lower electrode 20 to be improved, whereby the ferroelectric characteristics can be recovered.

In the method of manufacturing a ferroelectric capacitor of the present embodiment, the ferroelectric capacitor may be patterned by etching or the like after forming the upper electrode 50 over the substrate 10, and a heat treatment for recovering the ferroelectric characteristics may be performed at a pressure of two atmospheres or more as post annealing. This enables the ferroelectric capacitor to recover from process damage in the etching step.

The post annealing may be performed by slowly heating the ferroelectric capacitor using furnace annealing (FA), or by rapidly heating the ferroelectric capacitor using a rapid thermal annealing method.

The above-described heat treatment may be performed in an atmosphere such as a gas inert to vaporization of the metal material which makes up the complex oxide, such as nitrogen, argon, or xenon. The effect of reducing vaporization of the metal material which makes up the complex oxide can be further increased by performing the heat treatment in such an atmosphere.

Pressurization in a plurality of stages may be performed in at least either the temperature raising process or the temperature lowering process during the heat treatment.

A further detailed example of the method of manufacturing the second ferroelectric capacitor according to the present embodiment is described below with reference to the drawings.

EXAMPLE 5

In this example, a ferroelectric capacitor including a complex oxide consisting of $Pb(Zr_{0.35},Ti_{0.65})O_3$ over a given substrate on which a Pt electrode was formed as a ceramic film was formed, and an examination was conducted.

Figure 16:
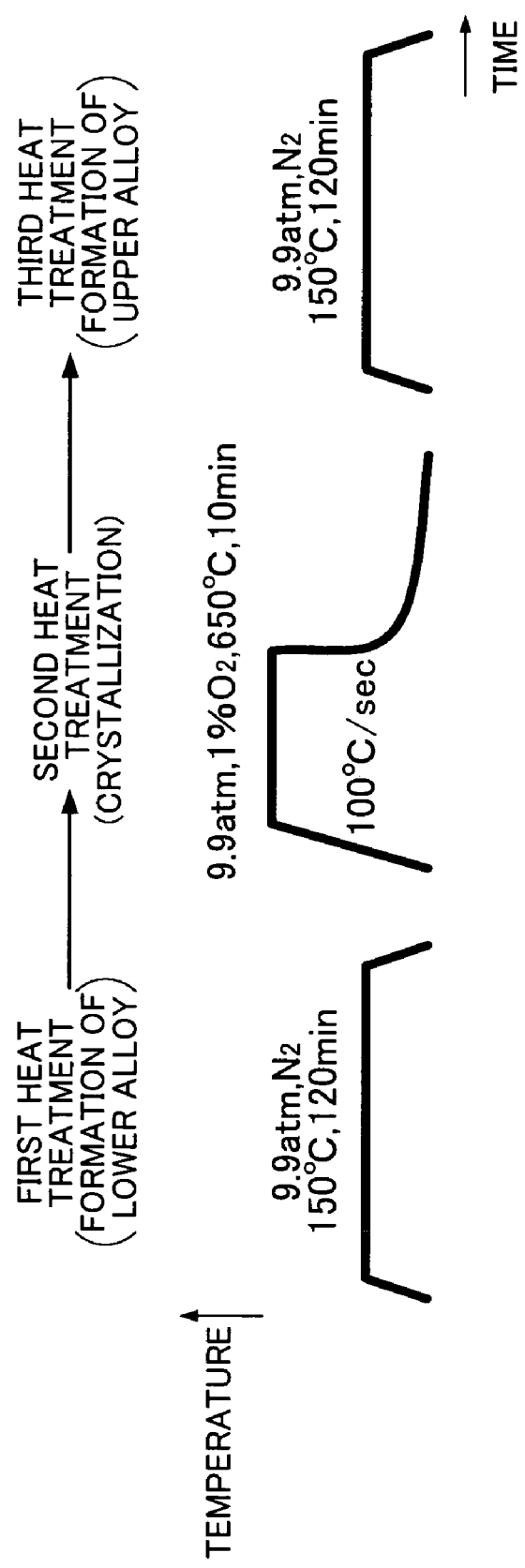
FIG. 16 shows a heat treatment in a manufacturing step of an example 5.

A 0.1 wt % sol-gel solution for forming $PbO_2$ was applied to a Pt electrode by spin coating (3000 rpm, 30 sec). As shown in FIG. 16, the applied solution was subjected to a first heat treatment in a nitrogen atmosphere at a pressure of 9.9 atmospheres at 150° C. for 120 minutes to form a $PbPt_3$ film which is an alloy of Pb which is the metal material for the complex oxide and the Pt electrode which is the lower electrode.

A PZT sol-gel solution (Zr/Ti=35/65) adjusted to the stoichiometric composition was applied to the $PbPt_3$ film by spin coating (3000 rpm, 30 sec) and presintered at 400° C. for five minutes. This step was repeated three times to form a raw material with a thickness of 150 nm on the Pt electrode.

As shown in FIG. 16, the raw material was crystallized by heating the raw material to 650° C. at a temperature raising rate of 100° C./sec in an atmosphere which is pressurized to 9.9 atmospheres and contained oxygen at a volume ratio of 1%, subjecting the raw material to a second heat treatment in which the raw material is heated at 650° C. for 10 minutes to form a PZT film having a perovskite structure.

A 0.1 wt % sol-gel solution for forming $PbO_2$ was applied to the PZT film by spin coating (3000 rpm, 30 sec), and a Pt electrode was formed on the sol-gel solution as an upper electrode. As shown in FIG. 16, a $PbPt_3$ film which is an alloy of Pb which is the metal material for the complex oxide and Pt which is the metal material for the upper Pt electrode was formed at the interface between the PZT film and the upper Pt electrode by performing a third heat treatment in nitrogen atmosphere at a pressure of 9.9 atmospheres at 150° C. for 120 minutes. Then, post annealing was performed by using the rapid thermal annealing method at a pressurized state in the same manner as in the second heat treatment to obtain a ferroelectric capacitor.

As a comparative example for the ferroelectric capacitor obtained by the manufacturing method of this example, a ferroelectric capacitor (comparative example 5) was formed by using a raw material solution in which Pb was added to a sol-gel solution adjusted to the stoichiometric composition so that the amount of Pb was 20% excess at a molar ratio. The raw material solution was applied to the Pt electrode by spin coating (3000 rpm, 30 sec) and presintered at 400° C. for five minutes. This step was repeated three times to form a raw material with a thickness of 150 nm. As shown in FIG. 4, the raw material was heated to 650° C. at a temperature raising rate of 100° C./sec in an atmosphere which is set at atmospheric pressure and contained a sufficient amount of oxygen by using the rapid thermal annealing method, and then heated for 10 minutes to obtain a PZT film on the Pt electrode. An upper electrode was formed on the PZT film, and post annealing was performed at a pressurized state by using the rapid thermal annealing method to obtain a ferroelectric capacitor of a conventional method 2.

The fatigue characteristics were examined for the ferroelectric capacitors obtained by the manufacturing method of this example and the manufacturing method of the comparative example 5 by applying a triangular wave pulse at 2 V and 66 Hz ten times and applying a rectangular wave pulse at 1.5 V and 500 kHz $10^8$ times or more to cause polarization reversal to occur.

Figure 17C:
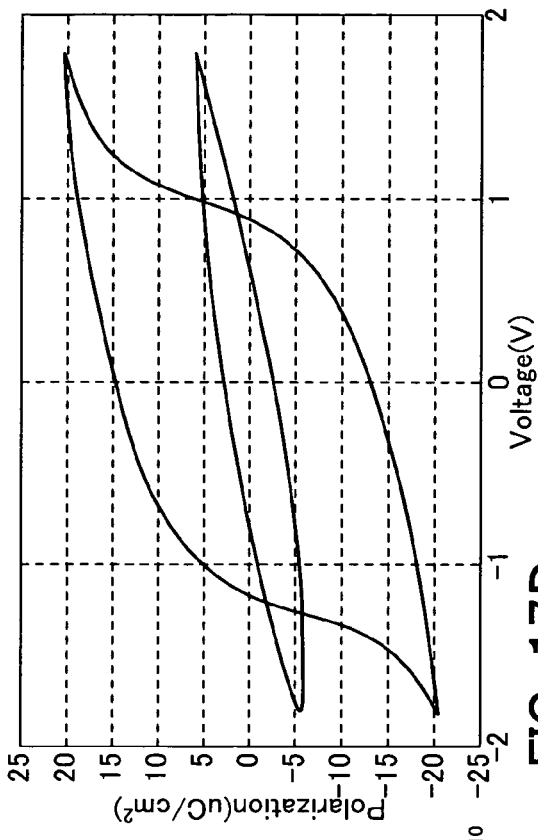
FIGS. 17A and 17C show fatigue characteristics of a ferroelectric capacitor according to a comparative example 5.
Figure 17D:
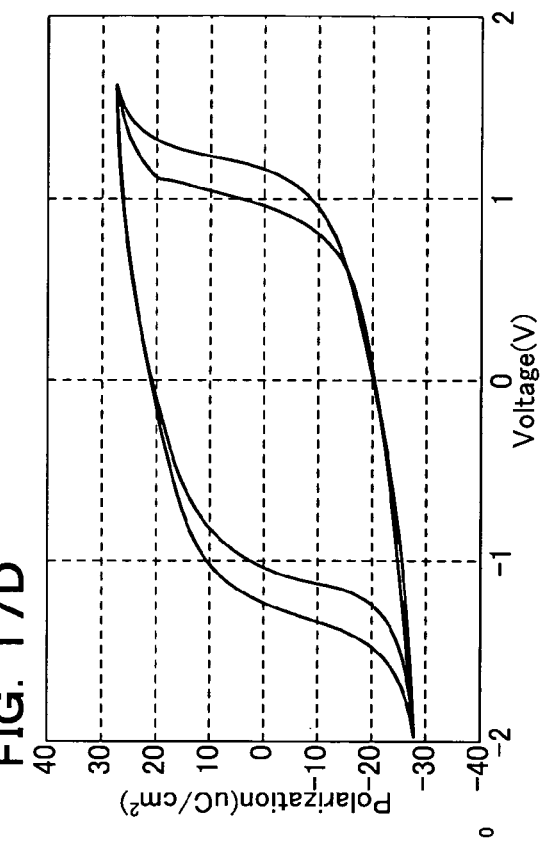
FIGS. 17B and 17D show fatigue characteristics of a ferroelectric capacitor according to the example 5.
Figure 17A:
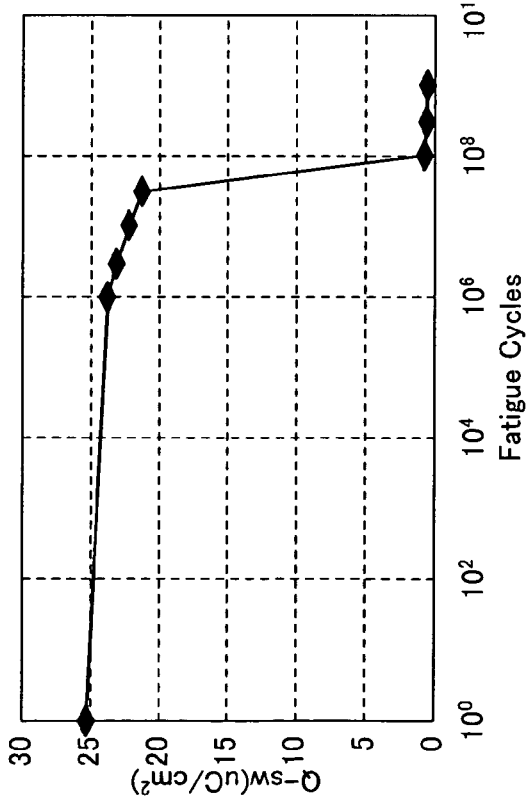
Figure 17B:
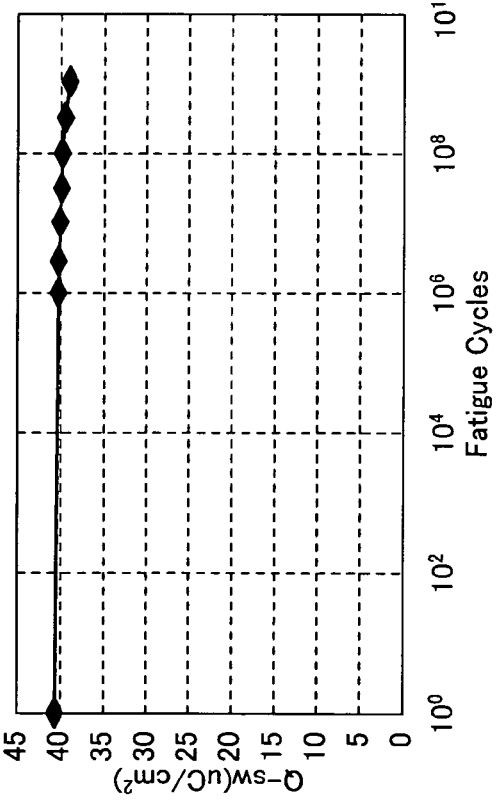

FIGS. 17A to 17D show the fatigue characteristics. FIGS. 17A and 17C show the case of the comparative example 5. FIGS. 17B and 17D show the case of the manufacturing method of this example.

As shown in FIG. 17A, the characteristics rapidly decrease near the point at which the number of polarization reversals exceeds $10^8$ in the comparative example 5. As shown in FIG. 17B, in this example, deterioration of characteristics due to fatigue is not observed even if the number of polarization reversals exceeds $10^8$. Changes in hysteresis characteristics before and after the fatigue test are compared as shown in FIGS. 17C and 17D. As shown in FIG. 17C, the ferroelectric capacitor of the comparative example 5 shows hysteresis characteristics only to a small extent after the fatigue test. As shown in FIG. 17D, the ferroelectric capacitor of this example shows an excellent hysteresis shape having squareness equal to that before the fatigue test. In the ferroelectric capacitor of this example, since the alloy film is formed at the interface between the upper and lower electrodes and the PZT film, the strain caused by lattice mismatch is considered to be reduced. In the manufacturing method of this example, since the heat treatment for crystallization is performed by rapid heating using the rapid thermal annealing method in a pressurized and low oxygen concentration state, removal of Pb during the crystallization process can be prevented, whereby a highly oriented PZT film can be obtained. This is considered to contribute to improvement of the fatigue characteristics.

As described above, it was confirmed that the ferroelectric capacitor has excellent hysteresis characteristics and excellent fatigue characteristics since the manufacturing method of the present embodiment includes the alloy film formation process at the upper and lower interfaces of the ceramic film and the crystallization process of the ceramic film in which the rapid thermal annealing method is performed in a pressurized and low oxygen concentration state.

6. Semiconductor Device

Application examples of the method of manufacturing the first and second ferroelectric capacitors are described below.

APPLICATION EXAMPLE 1

Figure 18:
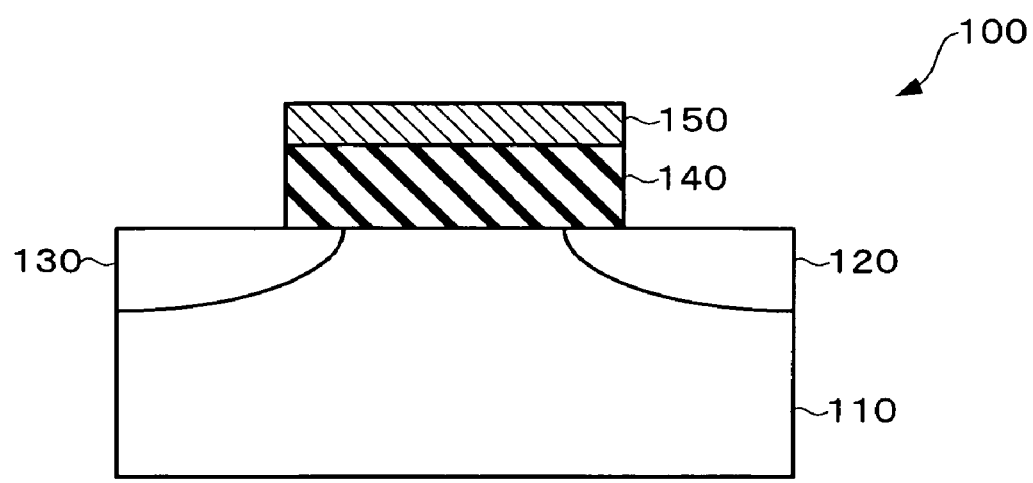
FIG. 18 is a cross-sectional view showing a semiconductor device according to an application example 1.

FIG. 18 is a cross-sectional view schematically showing a semiconductor device 100 to which a ceramic film obtained by the manufacturing method described in each embodiment is applied.

The semiconductor device 100 has an MISFET (metal-insulating film-semiconductor FET) structure in which a gate insulating film 140 and a gate electrode 150 are formed over a semiconductor substrate 110 in which source and drain regions 120 and 130 are formed.

In the semiconductor device 100, the source and drain regions 120 and 130 may be formed by using a conventional semiconductor manufacturing method. The gate electrode 150 may be formed by using a conventional semiconductor manufacturing method. As the gate insulating film 140, a ferroelectric ceramic film formed by using the method of manufacturing the first or second ferroelectric capacitor described in the above embodiment is used. In order to form an excellent interface between the gate insulating film 140 and the semiconductor substrate 110, a paraelectric layer or a double layer consisting of a metal and a paraelectric may be inserted between the gate insulating film 140 and the semiconductor substrate 110.

The semiconductor device 100 according to the present embodiment functions as a semiconductor memory by reading data by utilizing a change in drain current based on polarization of the gate insulating film 140 which is the ferroelectric ceramic film. Since the gate insulating film 140 of the semiconductor device 100 is formed of a ferroelectric ceramic film obtained by using the manufacturing method described in the above embodiment, the gate insulating film 140 has hysteresis characteristics saturated at a low voltage. Therefore, the semiconductor device 100 according to the present embodiment can be driven at high speed or at a low voltage, whereby power consumption of the devices can be reduced.

APPLICATION EXAMPLE 2

Figure 19A:
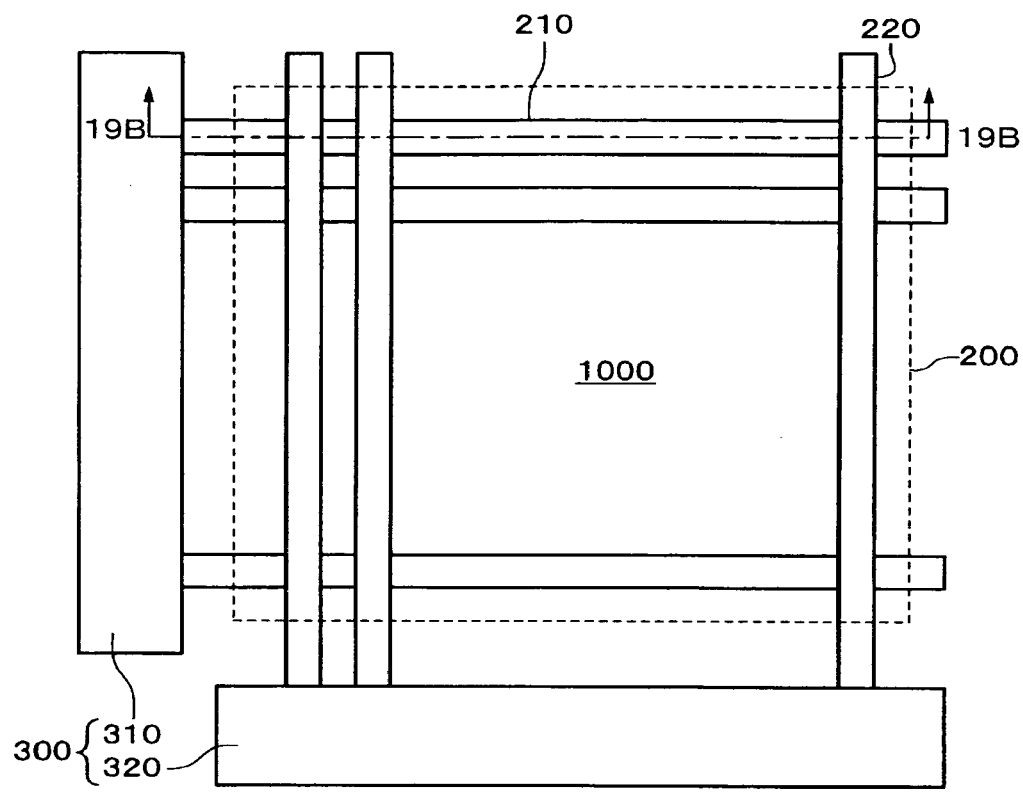
FIG. 19A is a plan view showing a semiconductor device according to an application example 2.
Figure 19B:
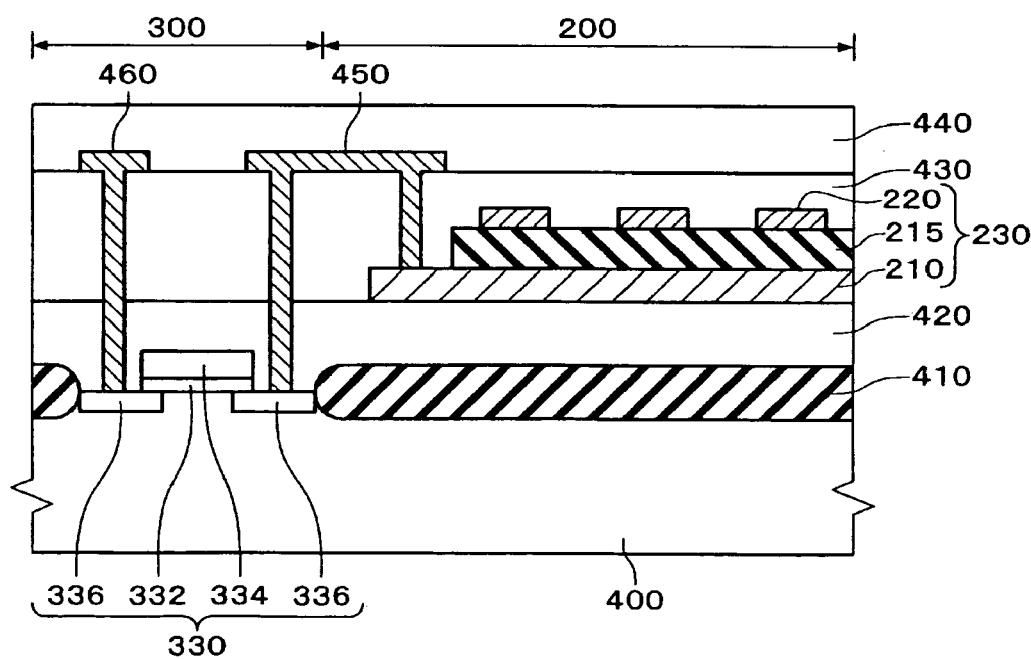
FIG. 19B is a cross-sectional view showing a semiconductor device according to the application example 2.

FIGS. 19A and 19B schematically show a semiconductor device 1000 using a ferroelectric capacitor obtained by using the manufacturing method in the above embodiment. FIG. 19A shows a planar configuration of the semiconductor device 1000. FIG. 19B shows a cross section of FIG. 19A.

As shown in FIG. 19A, the semiconductor device 1000 includes a memory cell array 200 and a peripheral circuit section 300. The memory cell array 200 and the peripheral circuit section 300 are formed in different layers. The peripheral circuit section 300 is disposed over a semiconductor substrate 400 in a region differing from the memory cell array 200. As specific examples of the peripheral circuit section 300, a Y gate, sense amplifier, input-output buffer, X address decoder, Y address decoder, or address buffer can be given.

In the memory cell array 200, lower electrodes 210 (wordlines) for selecting rows and upper electrodes 220 (bit lines) for selecting columns are arranged to intersect. The lower electrodes 210 and the upper electrodes 220 are in the shape of stripes formed of a plurality of linear signal electrodes. The signal electrodes may be formed so that the lower electrodes 210 are the bitlines and the upper electrodes 220 are the wordlines.

As shown in FIG. 19B, a ferroelectric ceramic film 215 is disposed between the lower electrode 210 and the upper electrode 220. In the memory cell array 200, a memory cell which functions as a ferroelectric capacitor 230 is formed in a region in which the lower electrode 210 intersects the upper electrode 220. The ferroelectric capacitor 230 is formed by using the manufacturing method according to the above embodiment. Therefore, an alloy film consisting of a compound of the material for the ferroelectric ceramic film 215 and the material for the lower electrode 210 or the upper electrode 220 is formed at the interface between the ferroelectric ceramic film 215 and the lower electrode 210 or the upper electrode 220. It suffices that the ferroelectric ceramic film 215 be disposed at least at the intersecting region of the lower electrode 210 and the upper electrode 220.

In the semiconductor device 1000, a second interlayer dielectric 430 is formed to cover the lower electrodes 210, the ferroelectric layer 215, and the upper electrodes 220. An insulating protective layer 440 is formed on the second interlayer dielectric 430 so as to cover interconnect layers 450 and 460.

As shown in FIG. 19A, the peripheral circuit section 200 includes various circuits for selectively writing or reading data into or from the memory cell 200. For example, the peripheral circuit section 300 includes a first driver circuit 310 for selectively controlling the lower electrodes 210, a second driver circuit 320 for selectively controlling the upper electrodes 220, and a signal detection circuit such as a sense amplifier (not shown), for example.

As shown in FIG. 19B, the peripheral circuit section 300 includes a MOS transistor 330 formed over the semiconductor substrate 400. The MOS transistor 330 includes a gate insulating film 332, a gate electrode 334, and source/drain regions 336. The MOS transistors 330 are separated by an element isolation region 410. A first interlayer dielectric 410 is formed over the semiconductor substrate 400 on which the MOS transistor 330 is formed. The peripheral circuit section 300 is electrically connected with the memory cell array 200 through an interconnect layer 51.

An example of write and read operations of the semiconductor device 1000 is described below.

In the read operation, a read voltage is applied to the capacitor of the selected memory cell. This also serves as a write operation of "0". At this time, current flowing through the selected bitline or a potential when causing the bitline to be in a high impedance state is read by using the sense amplifier. A given voltage is applied to the capacitors of the unselected memory cells in order to prevent occurrence of crosstalk during reading.

In the write operation of "1", a write voltage which causes the polarization state to be reversed is applied to the capacitor of the selected memory cell. In the case of writing "0", a write voltage which does not cause the polarization state to be reversed is applied to the capacitor of the selected memory cell, whereby the "0" state written during the read operation is retained. A given voltage is applied to the capacitors of the unselected memory cells in order to prevent occurrence of crosstalk during writing.

In the semiconductor device 1000, the ferroelectric capacitor 230 formed by using the manufacturing method in the above embodiment has hysteresis characteristics which are saturated at a low voltage. Therefore, the semiconductor device 1000 can be driven at a low voltage or at high speed, whereby power consumption of the devices can be reduced. Since the ferroelectric capacitor 230 has excellent fatigue characteristics, the semiconductor device 1000 enables reliability of the devices to be increased and yield to be improved.

The preferred embodiments of the present invention are described above. However, the present invention is not limited to these embodiments. Various modifications and variations are possible within the scope of the present invention.

What is claimed is:

1. A method of manufacturing a ceramic film, comprising:
crystallizing a raw material including a complex oxide by subjecting the raw material to a heat treatment in an atmosphere pressurized to two atmospheres or more and containing oxygen at a volume ratio greater than or equal to 1% but less than or equal to 10%,
wherein the heat treatment includes pressurizing to two atmospheres or more at least before raising a temperature.

2. A method of manufacturing a ceramic film, comprising:
crystallizing a raw material including a complex oxide by subjecting the raw material to a heat treatment in an atmosphere pressurized to two atmospheres or more and containing oxygen at a volume ratio greater than or equal to 1% but less than or equal to 10%,
wherein the complex oxide includes Pb in constituent elements, and
wherein the heat treatment includes raising a temperature after pressurizing to two atmospheres or more at 100° C. or less in a temperature raising process.

3. A method of manufacturing a ceramic film, comprising:
crystallizing a raw material including a complex oxide by subjecting the raw material to a heat treatment in an atmosphere pressurized to two atmospheres or more and containing oxygen at a volume ratio greater than or equal to 1% but less than or equal to 10%,
wherein a temperature raising process of the heat treatment is performed in a pressurized state with respect to atmospheric pressure, and a temperature lowering process of the heat treatment is performed at a reduced pressure with respect to the pressurized state.

4. A method of manufacturing a ceramic film, comprising:
crystallizing a raw material including a complex oxide by subjecting the raw material to a heat treatment in an atmosphere pressurized to two atmospheres or more and containing oxygen at a volume ratio greater than or eciual to 1% but less than or equal to 10%,
wherein the raw material is a mixture of a sol-gel raw material and an MOD raw material, the sol-gel raw material including at least one of a hydrolysate and a polycondensate of the complex oxide, and the MOD (Metal Organic Decomposition) raw material including constituent elements of the complex oxide in an organic solvent.

5. A method of manufacturing a ceramic film, comprising:
crystallizing a raw material including a complex oxide by subjecting the raw material to a heat treatment in an atmosphere pressurized to two atmospheres or more and containing oxygen at a volume ratio greater than or equal to 1% but less than or equal to 10%,
wherein the raw material includes the complex oxide and a paraelectric material having a catalytic effect on the complex oxide.

6. The method of manufacturing a ceramic film as defined in claim 5, wherein the paraelectric material includes an oxide which includes Si or Ge in constituent elements or an oxide which includes Si and Ge in constituent elements.

* * * * *